（12）United States Patent
Ohura

(10) Patent No.: US 11,769,774 B2
(45) Date of Patent: Sep. 26, 2023

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Masashi Ohura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 189 days.

(21) Appl. No.: 16/964,682

(22) PCT Filed: Mar. 15, 2019

(86) PCT No.: PCT/JP2019/010754
§ 371 (c)(1),
(2) Date: Jul. 24, 2020

(87) PCT Pub. No.: WO2019/188386
PCT Pub. Date: Oct. 3, 2019

(65) Prior Publication Data
US 2021/0005651 A1 Jan. 7, 2021

(30) Foreign Application Priority Data
Mar. 29, 2018 (JP) .................. 2018-065006

(51) Int. Cl.
*H01L 27/146* (2006.01)
(52) U.S. Cl.
CPC .. *H01L 27/14609* (2013.01); *H01L 27/14679* (2013.01); *H01L 27/1463* (2013.01)
(58) Field of Classification Search
CPC ......... H01L 27/14609; H01L 27/14679; H01L 27/1463; H01L 27/14643; H01L 27/1461;
(Continued)

(56) References Cited

U.S. PATENT DOCUMENTS

2005/0093036 A1 5/2005 Han
2011/0032405 A1* 2/2011 Nozaki ............. H01L 27/14603
257/E31.097
(Continued)

FOREIGN PATENT DOCUMENTS

JP 2012-084610 4/2012
JP 2013-041915 2/2013
(Continued)

OTHER PUBLICATIONS

International Search Report and Written Opinion prepared by the Japanese Patent Office dated May 31, 2019, for International Application No. PCT/JP2019/010754.

*Primary Examiner* — Samuel Park
(74) *Attorney, Agent, or Firm* — SHERIDAN ROSS P.C.

(57) ABSTRACT

The present technology relates to a solid-state imaging device and an electronic device for increasing the degree of freedom regarding arrangement of transistors. Provided are a photoelectric conversion unit, a trench penetrating a semiconductor substrate in a depth direction and formed between the photoelectric conversion units respectively formed in adjacent pixels, and a PN junction region configured by a P-type region and an N-type region on a sidewall of the trench, in which a part of sides surrounding the photoelectric conversion unit includes a region where the P-type region is not formed or a region where the P-type region is thinly formed. The PN junction region is formed on at least one side of four sides surrounding the photoelectric conversion unit, and the P-type region is not formed on the remaining sides. The present technology can be applied to, for example, a back-illuminated-type CMOS image sensor.

20 Claims, 39 Drawing Sheets

(58) Field of Classification Search
CPC ........... H01L 27/14614; H01L 27/1464; H01L 21/76; H01L 27/14623; H01L 27/14689; H01L 31/10; H04N 5/369; H04N 25/70
See application file for complete search history.

(56) References Cited

U.S. PATENT DOCUMENTS

| | | |
|---|---|---|
| 2012/0086845 A1 | 4/2012 | Enomoto et al. |
| 2013/0037900 A1 | 2/2013 | Abe |
| 2015/0228684 A1* | 8/2015 | Yamashita ........ H01L 27/14641 257/292 |
| 2015/0228884 A1 | 8/2015 | Yamashita |
| 2015/0243700 A1 | 8/2015 | Morooka |
| 2015/0380447 A1 | 12/2015 | Chou et al. |
| 2018/0033809 A1 | 2/2018 | Tayanaka et al. |
| 2019/0043901 A1 | 2/2019 | Honda et al. |

FOREIGN PATENT DOCUMENTS

| | | |
|---|---|---|
| JP | 2015-153772 | 8/2015 |
| JP | 2015-162603 | 9/2015 |
| JP | 2018-162917 | 9/2016 |
| WO | WO 2017/187957 | 11/2017 |

\* cited by examiner

SOLID-STATE IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2019/010754 having an international filing date of 15 Mar. 2019, which designated the United States, which PCT application claimed the benefit of Japanese Patent Application No. 2018-065006 filed 29 Mar. 2018, the entire disclosures of each of which are incorporated herein by reference.

TECHNICAL FIELD

The present technology relates to a solid-state imaging device and an electronic device, and in particular, relates to a solid-state imaging device and an electronic device having a P-type solid phase diffusion layer and an N-type solid phase diffusion layer formed on a sidewall of an inter-pixel light-shielding wall formed between pixels to form a strong electric field region and hold electric charges in the strong electric field region, thereby improving a saturated electric charge amount Qs of each pixel.

BACKGROUND ART

Conventionally, a technology of forming a P-type diffusion layer and an N-type diffusion layer on a sidewall of a trench formed between pixels to form a strong electric field region and holding electric charges in the strong electric field region with a view to improve the saturated electric charge amount Qs of each pixel of a solid-state imaging device is known (for example, see Patent Document 1).

CITATION LIST

Patent Document

Patent Document 1: Japanese Patent Application Laid-Open No. 2015-162603

SUMMARY OF THE INVENTION

Problems to be Solved by the Invention

However, the structure disclosed in Patent Document 1 has a possibility that the pinning of a silicon (Si) substrate on a light incident side is weakened, a generated electric charge flows into a photodiode and Dark characteristics deteriorate, and for example, a white point occurs and a dark current is generated. Furthermore, formation of the strong electric field region may limit a region where transistors and the like can be arranged.

The present technology has been made in view of the foregoing, and can suppress deterioration of Dark characteristics and increase the degree of freedom of arrangement of transistors and the like.

Solutions to Problems

A solid-state imaging device according to one aspect of the present technology includes a photoelectric conversion unit configured to perform photoelectric conversion; a trench penetrating a semiconductor substrate in a depth direction and formed between the photoelectric conversion units respectively formed in adjacent pixels; and a PN junction region configured by a P-type region and an N-type region on a sidewall of the trench, in which a part of sides surrounding the photoelectric conversion unit includes a region where the P-type region is not formed or a region where the P-type region is thinly formed.

An electronic device according to one aspect of the present technology is an electronic device in which a solid-state imaging device is mounted, the solid-state imaging device including: a photoelectric conversion unit configured to perform photoelectric conversion; a trench penetrating a semiconductor substrate in a depth direction and formed between the photoelectric conversion units respectively formed in adjacent pixels; and a PN junction region configured by a P-type region and an N-type region on a sidewall of the trench, in which a part of sides surrounding the photoelectric conversion unit includes a region where the P-type region is not formed or a region where the P-type region is thinly formed.

The solid-state imaging device according to one aspect of the present technology includes the photoelectric conversion unit configured to perform photoelectric conversion, the trench penetrating a semiconductor substrate in a depth direction and formed between the photoelectric conversion units respectively formed in adjacent pixels, and a PN junction region including a P-type region and an N-type region on a sidewall of the trench. Furthermore, a part of sides surrounding the photoelectric conversion unit includes the region where the P-type region is not formed or the region where the P-type region is thinly formed.

The electronic device according to one aspect of the present technology includes the solid-state imaging device.

Effects of the Invention

According to the present technology, deterioration of Dark characteristics can be prevented, and the degree of freedom of arrangement of transistors and the like is increased.

Note that the effects described here are not necessarily limited, and any of effects described in the present disclosure may be exhibited.

MODE FOR CARRYING OUT THE INVENTION

Hereinafter, best modes for implementing the present technology (hereinafter referred to as embodiments) will be described in detail with reference to the drawings.

Since the present technology can be applied to an imaging device, a case where the present technology is applied to an imaging device will be described here as an example. Note that, here, description will be given by taking an imaging device as an example but the present technology is not limited to application to an imaging device and can be applied to various electronic devices using an imaging device as an image capturing unit (photoelectric conversion unit), such as an imaging device like a digital still camera or a video camera, a portable terminal device having an imaging function like a mobile phone, a copying machine using an imaging device as an image reading unit, or the like. Note that a module-type configuration mounted on an electronic device, that is, a camera module may be adopted as an imaging device.

Figure 1:
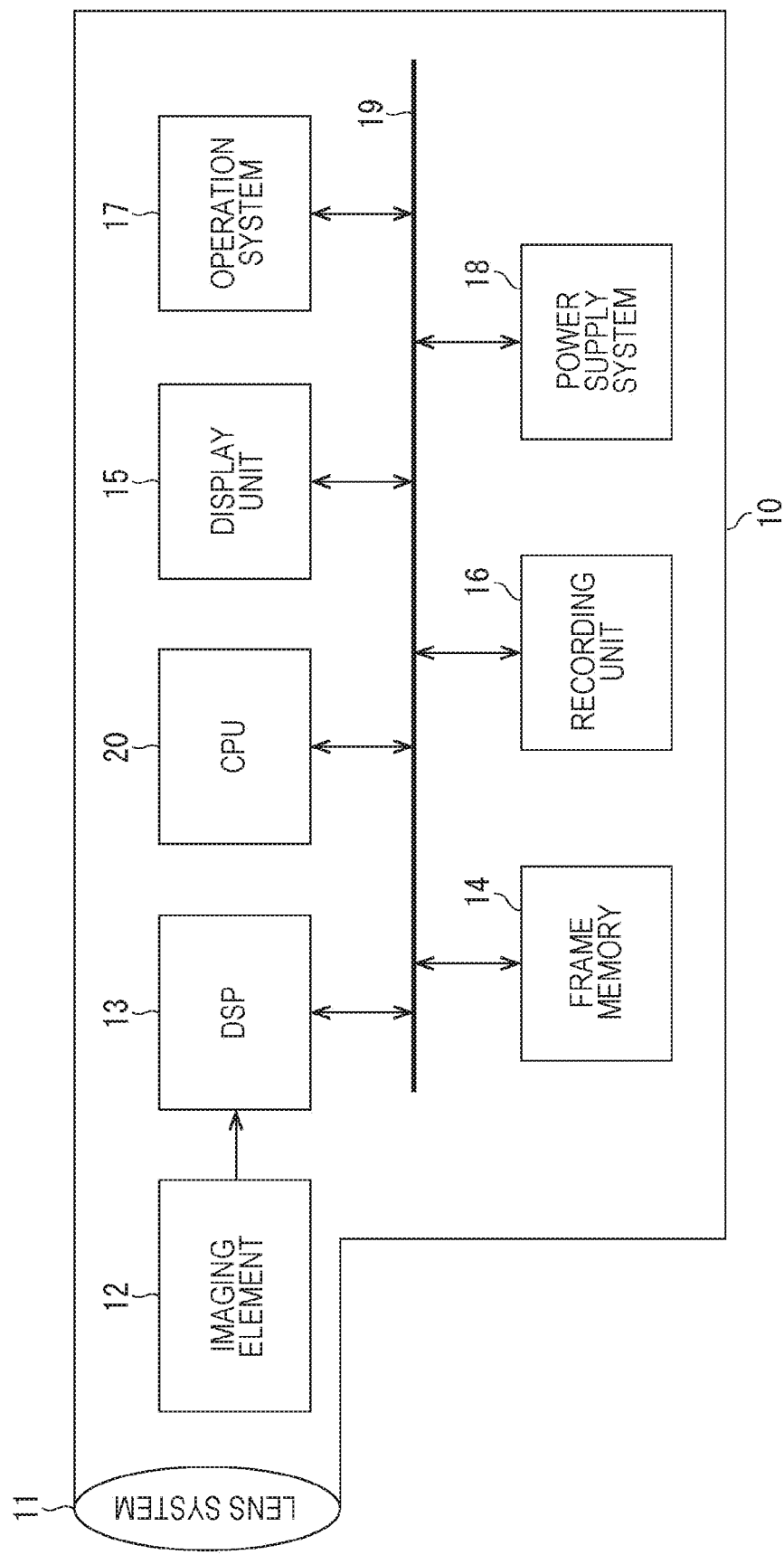
FIG. 1 is a diagram illustrating a configuration example of an imaging device.

FIG. 1 is a block diagram illustrating a configuration example of an imaging device that is an example of an electronic device of the present disclosure. As illustrated in FIG. 1, an imaging device 10 includes an optical system including a lens group 11 or the like, an imaging element 12, a DSP circuit 13 that is a camera signal processing unit, a frame memory 14, a display unit 15, a recording unit 16, an operation system 17, a power supply system 18, and the like.

Then, the DSP circuit 13, the frame memory 14, the display unit 15, the recording unit 16, the operation system 17, and the power supply system 18 are mutually connected through a bus line 19. A CPU 20 controls each unit in the imaging device 10.

The lens group 11 takes in incident light (image light) from an object and forms an image on an imaging surface of the imaging element 12. The imaging element 12 converts a light amount of the incident light imaged on the imaging surface by the lens group 11 into an electrical signal in pixel units and outputs the electrical signal as a pixel signal. As the imaging element 12, an imaging element (image sensor) including pixels to be described below can be used.

The display unit 15 includes a panel-type display unit such as a liquid crystal display unit or an organic electro luminescence (EL) display unit, and displays a moving image or a still image imaged by the imaging element 12. The recording unit 16 records the moving image or the still image captured by the imaging element 12 in a recording medium such as a hard disk drive (HDD) or a memory card.

The operation system 17 issues operation commands for various functions of the present imaging device under an operation by a user. The power supply system 18 appropriately supplies various power sources serving as operating power sources of the DSP circuit 13, the frame memory 14, the display unit 15, the recording unit 16, and the operation system 17 to these supply targets.

<Configuration of Imaging Element>

Figure 2:
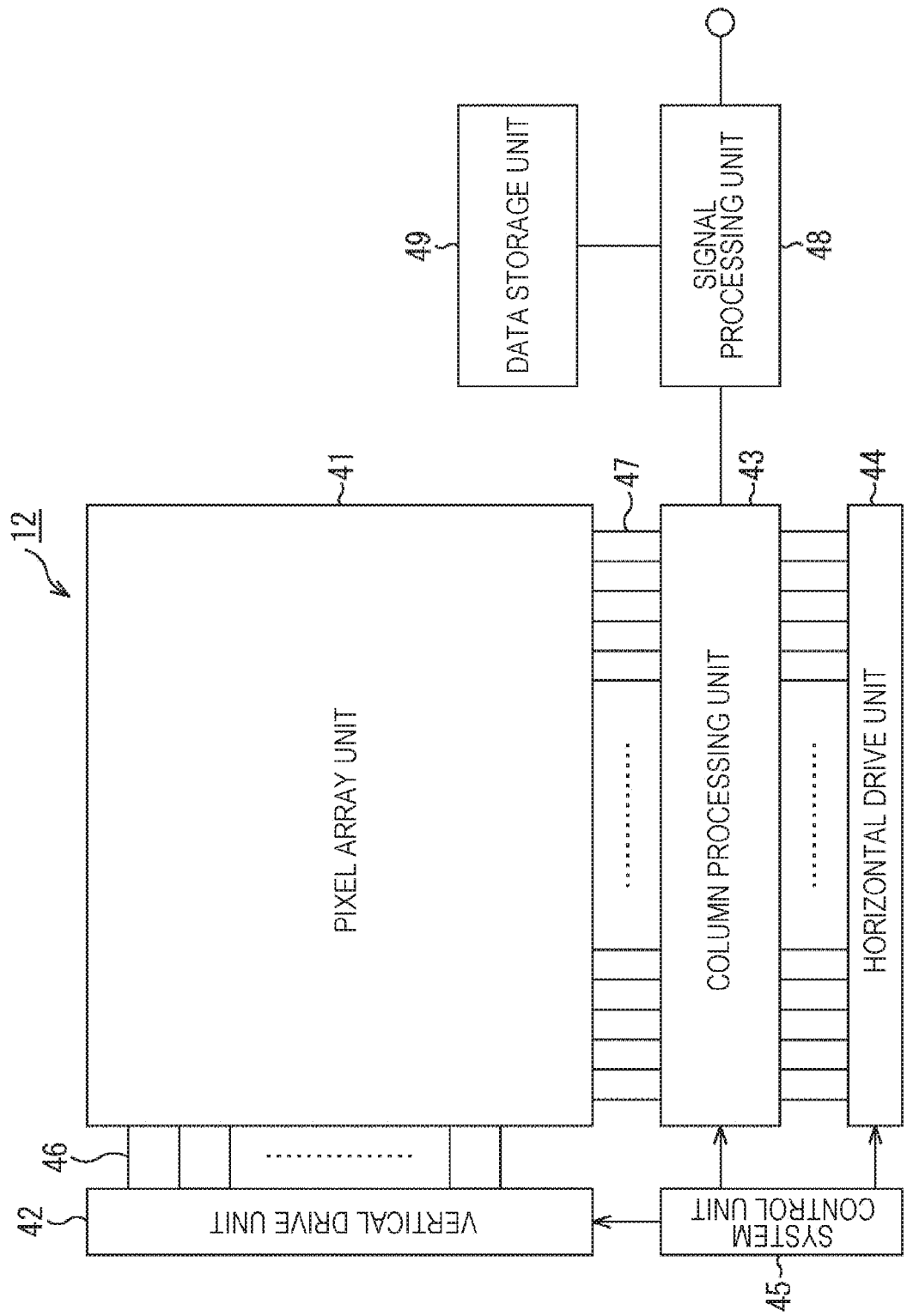
FIG. 2 is a diagram illustrating a configuration example of an imaging element.

FIG. 2 is a block diagram illustrating a configuration example of the imaging element 12. The imaging element 12 can be a complementary metal oxide semiconductor (CMOS) image sensor.

The imaging element 12 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) (not illustrated).

In the pixel array unit 41, unit pixels (for example, the pixels 50 in FIG. 3) each including a photoelectric conversion element that generates a photocharge having an electric charge amount corresponding to an incident light amount and accumulates the generated photocharge therein are two-dimensionally arranged in a matrix manner. Note that, hereinafter, the photocharge having the electric charge amount corresponding to the incident light amount may be simply described as "electric charge", and the unit pixel may be simply described as "pixel".

Moreover, in the pixel array unit 41, a pixel drive line 46 is formed for each row in a right-left direction in FIG. 2 (a pixel array direction of a pixel row) and a vertical signal line 47 is formed for each column in an up-down direction in FIG. 2 (a pixel array direction of a pixel column) with respect to a pixel array in the matrix manner. One end of the pixel drive line 46 is connected to an output end corresponding to each row of the vertical drive unit 42.

The imaging element 12 further includes a signal processing unit 48 and a data storage unit 49. Processing by the signal processing unit 48 and the data storage unit 49 may be processing by an external signal processing unit, for example, a digital signal processor (DSP) provided on a separate substrate from the imaging element 12 or by software, or the signal processing unit 48 and the data storage unit 49 may be mounted on the same substrate as the imaging element 12.

The vertical drive unit 42 is a pixel drive unit including a shift register, an address decoder, and the like, and drives all of pixels of the pixel array unit 41 at the same time or drives the pixels on a row basis, or the like. Although illustration of a specific configuration is omitted, the vertical drive unit 42 has a configuration including a readout scanning system and a sweepout scanning system, or batch sweeping and batch transfer.

The readout scanning system sequentially selects and scans the unit pixels of the pixel array unit 41 on a row basis in order to read signals from the unit pixels. In a case of row drive (rolling shutter operation), as for sweeping, sweepout scanning is performed for a readout row, for which readout scanning will be performed by the readout scanning system, ahead of the readout scanning by the time of a shutter speed. Furthermore, in a case of global exposure (global shutter operation), the batch sweeping is performed ahead of the batch transfer by the time of a shutter speed.

By the sweeping, unnecessary electric charges are swept out (reset) from the photoelectric conversion elements of the unit pixels of the readout row. Then, a so-called electronic shutter operation is performed by the sweeping out (resetting) of the unnecessary electric charges. Here, the electronic shutter operation refers to an operation of discarding photocharges of the photoelectric conversion element and starting new exposure (starting accumulation of photocharges).

The signal read by the readout operation by the readout scanning system corresponds to the amount of light incident on or after an immediately preceding readout operation or the electronic shutter operation. In the case of row drive, a period from readout timing by the immediately preceding readout operation or from sweepout timing by the electronic shutter operation to readout timing by the current readout operation is an accumulation period (exposure period) of the photocharges in the unit pixel. In the case of global exposure, a period from the batch sweeping to the batch transfer is an accumulation period (exposure period).

The pixel signal output from each unit pixel in the pixel row selectively scanned by the vertical drive unit 42 is supplied to the column processing unit 43 through each of the vertical signal lines 47. The column processing unit 43 performs, for each pixel column of the pixel array unit 41, predetermined signal processing for the pixel signal output from each unit pixel in the selected row through the vertical signal line 47, and temporarily stores the pixel signal after the signal processing.

Specifically, the column processing unit 43 performs at least noise removal processing, for example, correlated double sampling (CDS) processing as the signal processing. The correlated double sampling by the column processing unit 43 removes fixed pattern noises peculiar to pixels such as reset noise and variation in threshold value of an amplification transistor. Note that the column processing unit 43 can have an analog-digital (AD) conversion function, for example, in addition to the noise removal processing, and can output a signal level as a digital signal.

The horizontal drive unit 44 is configured by a shift register, an address decoder, and the like, and sequentially selects a unit circuit corresponding to the pixel column of the column processing unit 43. By the selective scanning by the horizontal drive unit 44, pixel signals processed by the column processing unit 43 are sequentially output to the signal processing unit 48.

The system control unit 45 is configured by a timing generator that generates various timing signals, and the like, and drives and controls the vertical drive unit 42, the column processing unit 43, the horizontal drive unit 44, and the like, on the basis of the various timing signals generated by the timing generator.

The signal processing unit 48 has at least an addition processing function and performs various types of signal processing such as addition processing for the pixel signal output from the column processing unit 43. The data storage unit 49 temporarily stores data necessary for the signal processing in the signal processing unit 48.

<Structure of Unit Pixel>

Next, a specific structure of the unit pixels 50 arranged in a matrix manner in the pixel array unit 41 will be described. According to the pixel 50 to be described below, the possibility that the pinning of a silicon (Si) substrate (a Si substrate 70 in FIG. 3) on the light incident side is weakened, a generated electric charge flows into a photodiode (a PD 71 in FIG. 3) and Dark characteristics deteriorate, and for example, a white point occurs and a dark current is generated can be reduced.

Configuration Example of Pixel in First Embodiment

Figure 3:
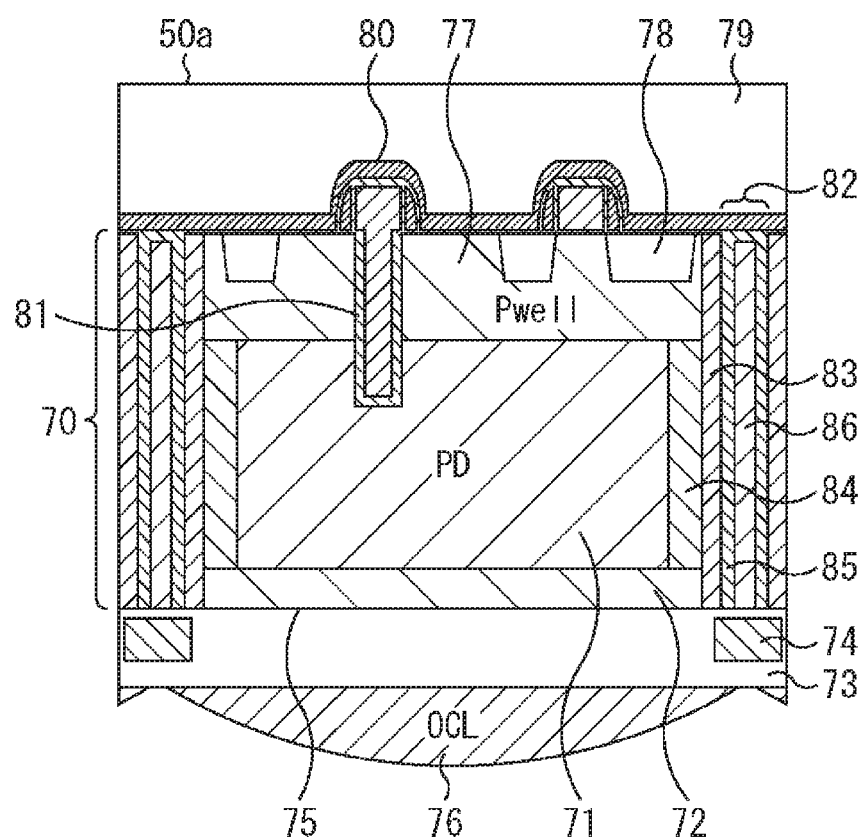
FIG. 3 is a vertical cross-sectional view illustrating a first configuration example of a pixel to which the present technology is applied.
Figure 4:
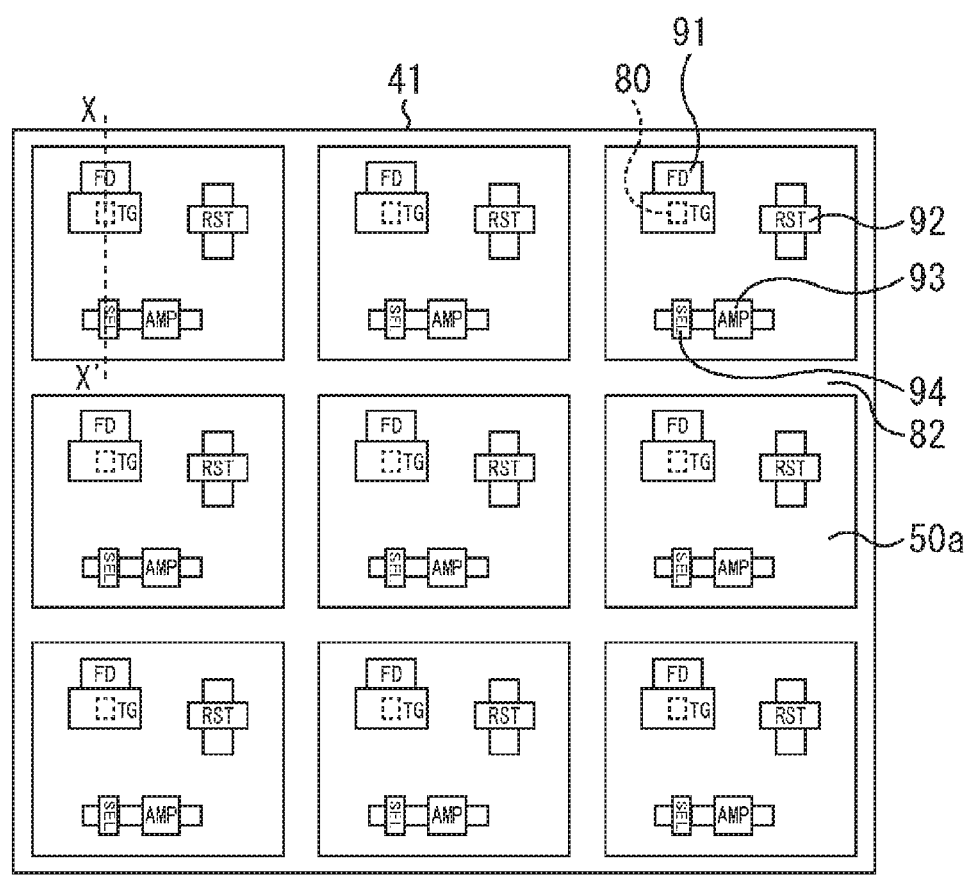
FIG. 4 is a plan view of a front side of the first embodiment of the pixel to which the present technology is applied.

FIG. 3 is a vertical cross-sectional view of a pixel 50a in the first embodiment of the pixel 50 to which the present technology is applied, and FIG. 4 is a plan view of a front side of the pixel 50a. Note that FIG. 3 corresponds to the position of line segment X-X' in FIG. 4.

The pixel 50 below will be described taking the case of a back-illuminated type as an example. However, the present technology can be applied to a front-illuminated type.

The pixel 50 illustrated in FIG. 3 includes a photodiode (PD) 71 that is a photoelectric conversion element of each pixel formed inside a Si substrate 70. A P-type region 72 is formed on a light incident side (a lower side and a back side in FIG. 3) of the PD 71, and a flattening film 73 is formed in a further lower layer of the P-type region 72. A boundary between the P-type region 72 and the flattening film 73 is a back surface Si interface 75.

A light-shielding film 74 is formed in the flattening film 73. The light-shielding film 74 is provided to prevent leakage of light into an adjacent pixel and is formed between the PD 71 and an adjacent PD 71. The light-shielding film 74 is formed using, for example, a metal material such as tungsten (W).

An on-chip lens (OCL) 76 for collecting incident light to the PD 71 is formed on the flattening film 73 and on the back side of the Si substrate 70. The OCL 76 can be formed using an inorganic material. For example, SiN, SiO, or SiOxNy (note that $0<x\leq 1$ and $0<y\leq 1$) can be used.

Although not illustrated in FIG. 3, a configuration in which a transparent plate such as a cover glass or a resin is adhered on the OCL 76 may be adopted. Furthermore, although not illustrated in FIG. 3, a configuration in which a color filter layer is formed between the OCL 76 and the flattening film 73 may be adopted. Furthermore, the color filter layer has a plurality of color filters provided for each pixel, and the colors of the color filters can be arranged according to a Bayer array, for example.

An active region (Pwell) 77 is formed on an opposite side (an upper side and a front side in FIG. 3) of the light incident side of the PD 71. In the active region 77, an element isolation region (hereinafter referred to as shallow trench Isolation (STI)) 78 for isolating pixel transistors and the like is formed.

A wiring layer 79 is formed on the front side (upper side in FIG. 3) of the Si substrate 70 and on the active region 77, and a plurality of transistors is formed in the wiring layer 79. FIG. 3 illustrates an example in which the transfer transistor 80 is formed. The transfer transistor (gate) 80 is formed using a vertical transistor. That is, in the transfer transistor (gate) 80, a vertical transistor trench 81 is opened, and a transfer gate (TG) 80 for reading the electric charge from the PD 71 is formed in the opening.

Moreover, pixel transistors such as an amplifier (AMP) transistor, a selection (SEL) transistor, and a reset (RST) transistor are formed on the front side of the Si substrate 70. Arrangement of these transistors will be described with reference to FIG. 4, and operations will be described with reference to the circuit diagram in FIG. 5.

A trench is formed between the pixels 50a. This trench is referred to as deep trench isolation (DTI) 82. This DTI 82 is formed in a shape penetrating the Si substrate 70 in a depth direction (a vertical direction in FIG. 3 and a direction from the front surface to the back surface) between adjacent pixels 50a. Furthermore, the DTI 82 also functions as a light-shielding wall between pixels so that unnecessary light does not leak into an adjacent pixel 50a.

A P-type solid phase diffusion layer 83 and an N-type solid phase diffusion layer 84 are formed between the PD 71 and the DTI 82 in order from the DTI 82 side toward the PD 71. The P-type solid phase diffusion layer 83 is formed along the DTI 82 to come in contact with the back surface Si interface 75 of the Si substrate 70. The N-type solid phase diffusion layer 84 is formed along the DTI 82 to come in contact with the P-type region 72 of the Si substrate 70.

Note that the solid phase diffusion layer refers to a layer obtained by forming a P-type layer and an N-type layer by impurity doping by a manufacturing method to be described below. However, in the present technology, the manufacturing method is not limited to the method by solid phase diffusion, and the P-type layer and the N-type layer generated by another manufacturing method such as ion implantation may be provided between the DTI 82 and the PD 71. Furthermore, the PD 71 in the present embodiment is configured by an N-type region. Photoelectric conversion is performed in part of or in the entire region of the N-type region.

While the P-type solid phase diffusion layer 83 is formed to come in contact with the back surface Si interface 75, the N-type solid phase diffusion layer 84 is not in contact with the back surface Si interface 75, and a gap is provided between the N-type solid phase diffusion layer 84 and the back surface Si interface 75.

With such a configuration, a PN junction region of the P-type solid phase diffusion layer 83 and the N-type solid phase diffusion layer 84 forms a strong electric field region, and holds the electric charge generated in the PD 71. According to the configuration, the P-type solid phase diffusion layer 83 and the N-type solid phase diffusion layer 84 formed along the DTI 82 forms the strong electric field region and can hold the electric charge generated in the PD 71.

If the N-type solid phase diffusion layer 84 is formed along the DTI 82 to come in contact with the back surface Si interface 75 of the Si substrate 70, the pinning of the electric charge is weakened in a portion where the back surface Si interface 75 of the Si substrate 70 that is on the light incident surface side and the N-type solid phase diffusion layer 84 are in contact with each other. Therefore, there is a possibility that the generated electric charge flows into the PD 71, the Dark characteristics deteriorate, and for example, a white point occurs and a dark current is generated.

However, in the pixel 50a illustrated in FIG. 3, the N-type solid phase diffusion layer 84 is not in contact with the back surface Si interface 75 of the Si substrate 70, and is formed along the DTI 82 to come in contact with the P-type region 72 of the Si substrate 70. With such a configuration, weakening of the pinning of the electric charge can be prevented, and flowing of the electric charge into the PD 71 and deterioration of the Dark characteristics can be prevented.

Furthermore, in the pixel 50a illustrated in FIG. 3, a sidewall film 85 containing SiO2 is formed on an inner wall of the DTI 82, and a filling material 86 containing polysilicon is embedded inside the sidewall film.

The pixel 50a in the first embodiment has the configuration in which the P-type region 72 is provided on the back side, and the PD 71 and the N-type solid phase diffusion layer 84 are not present near the back surface Si interface 75. With the configuration, weakening of the pinning near the back surface Si interface 75 does not occur. Therefore, flowing of the generated electric charge into the PD 71 and deterioration of the Dark characteristics can be suppressed.

Note that, in the DTI 82, SiN may be adopted instead of SiO2 adopted for the sidewall film 85. Furthermore, doping polysilicon may be used instead of the polysilicon adopted for the filling material 86. In the case of adding the doping polysilicon or in the case of performing doping with N-type impurities or P-type impurities after adding the polysilicon, the pinning of the sidewall of the DTI 82 can be enhanced by applying a negative bias. Therefore, the Dark characteristics can be further improved.

Figure 5:
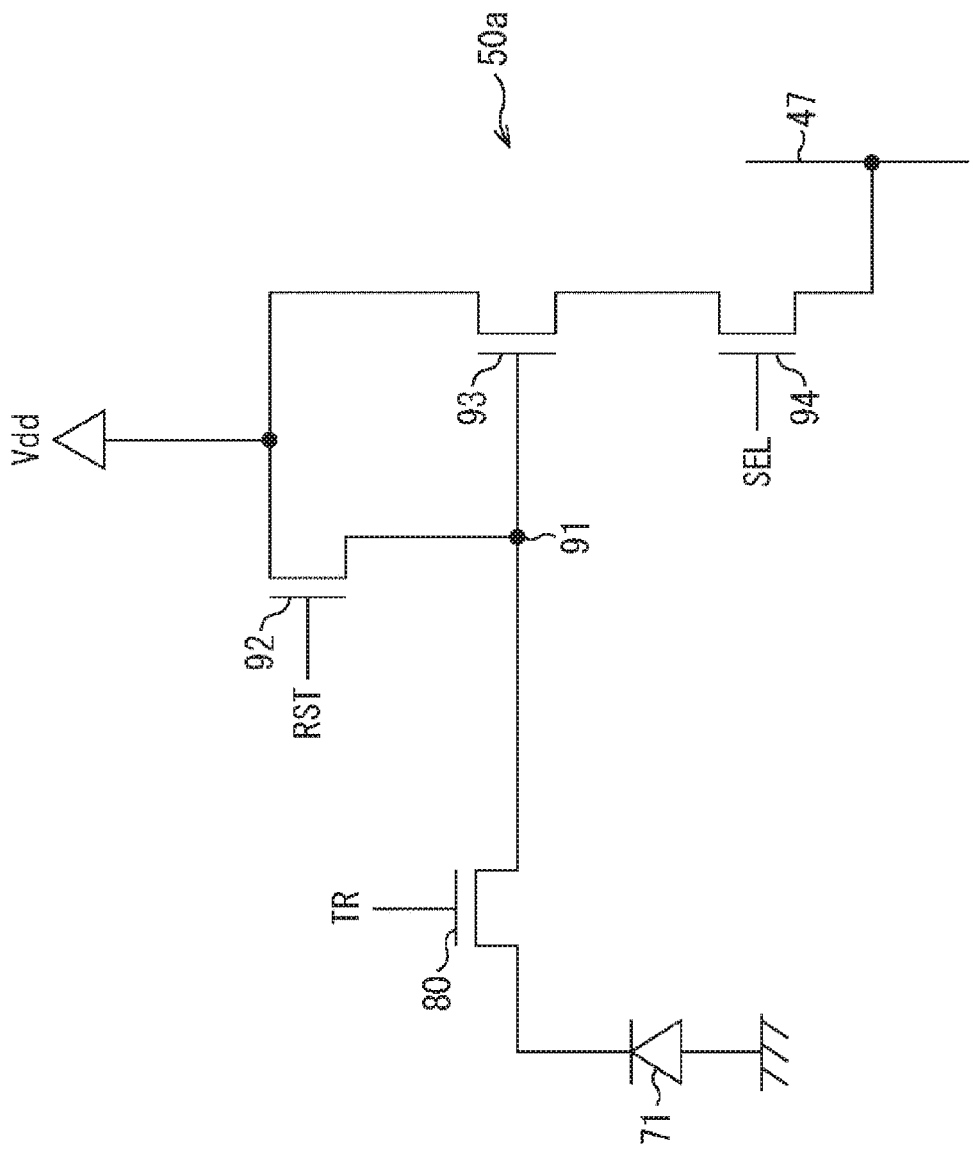
FIG. 5 is a circuit diagram of a pixel.

Arrangement of the transistors formed in the pixel 50*a* and operations of the transistors will be described with reference to FIGS. 4 and 5. FIG. 4 is a plan view of 3×3 nine pixels 50*a* arranged in the pixel array unit 41 (FIG. 2) as viewed from the front side (the upper side in FIG. 3), and FIG. 5 is a circuit diagram for describing a connection relationship among the transistors illustrated in FIG. 4.

In FIG. 4, one square represents one pixel 50*a*. As illustrated in FIG. 4, the DTI 82 is formed to surround the pixel 50*a* (the PD 71 included in the pixel 50*a*). Furthermore, the transfer transistor (gate) 80, a floating diffusion (FD) 91, a reset transistor 92, an amplification transistor 93, and a selection transistor 94 are formed on the front side of the pixel 50*a*.

The PD 71 generates and accumulates an electric charge (signal charge) according to a received light amount. The PD 71 has an anode terminal grounded and a cathode terminal connected to the FD 91 via the transfer transistor 80.

When turned on by a transfer signal TR, the transfer transistor 80 reads the electric charge generated in the PD 71 and transfers the read electric charge to the FD 91.

The FD 91 holds the electric charge read from the PD 71. When turned on by a reset signal RST, the reset transistor 92 resets a potential of the FD 91 as the electric charge accumulated in the FD 91 is discharged to a drain (constant voltage source Vdd).

The amplification transistor 93 outputs a pixel signal according to the potential of the FD 91. That is, the amplification transistor 93 constitutes a source follower circuit with a load MOS (not illustrated) as a constant current source connected via a vertical signal line 33. The pixel signal indicating a level according to the electric charge accumulated in the FD 91 is output from the amplification transistor 93 to the column processing unit 43 (FIG. 2) through the selection transistor 94 and the vertical signal line 47.

The selection transistor 94 is turned on when the pixel 31 is selected by a selection signal SEL, and outputs the pixel signal of the pixel 31 to the column processing unit 43 via the vertical signal line 33. The signal lines for transmitting the transfer signal TR, the selection signal SEL, and the reset signal RST correspond to the pixel drive lines 46 in FIG. 2.

The pixel 50*a* can be configured as described above, but the configuration is not limited thereto, and another configuration can be adopted.

<Method of Manufacturing DTI 82 and Periphery of DTI 82>

Figure 6:
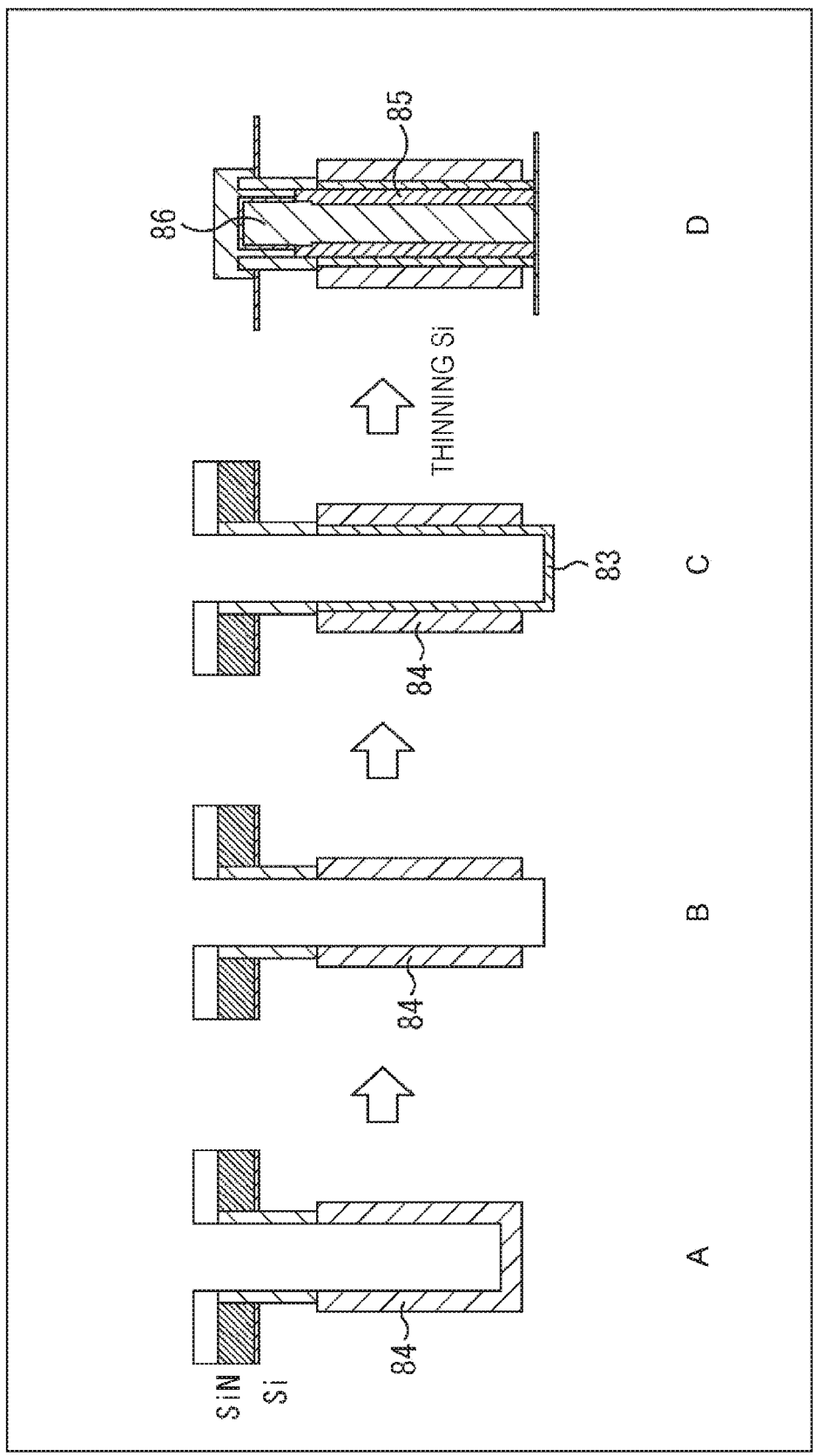
FIG. 6 is a diagram for describing a method of manufacturing a DTI 82 and a periphery of the DTI 82.

FIG. 6 is a diagram for describing a method of manufacturing a DTI 82 and a periphery of the DTI 82.

As illustrated in A in FIG. 6, in opening the DTI 82 in the Si substrate 70, the Si substrate 70 other than the position where the DTI 82 is to be formed is covered with a hard mask using SiN and SiO2, and the portion not covered with the hard mask is dry-etched to open a groove in the vertical direction up to a predetermined depth in the Si substrate 70.

Next, an SiO2 film containing phosphorus (P) that is an N-type impurity is formed inside the opened groove and thermal treatment is performed, so that a portion from the SiO2 film to the Si substrate 70 side is doped with the phosphorus (P) (hereinafter referred to as solid phase diffusion).

Next, as illustrated in B in FIG. 6, the SiO2 film containing P formed inside the opened groove is removed and then the thermal treatment is performed again, and the phosphorus (P) is diffused up to the inside of the Si substrate 70, so that the N-type solid phase diffusion layer 84 self-aligned in the current groove shape is formed. Thereafter, a bottom portion of the groove is etched by dry etching, thereby being extended in the depth direction.

Next, as illustrated in C in FIG. 6, a SiO2 film containing boron (B) that is a P-type impurity is formed inside the extended groove and then the thermal treatment is performed, and the boron (B) is solid-phase diffused from the SiO2 film to the Si substrate 70 side, so that the P-type solid phase diffusion layer 83 self-aligned in the extended groove shape is formed.

Thereafter, the SiO2 film containing boron (B) formed on an inner wall of the groove is removed.

Next, as illustrated in D in FIG. 6, a sidewall film 85 containing SiO2 is formed on an inner wall of the opened groove, and polysilicon is added to form the DTI 82. Thereafter, the pixel transistors and the wiring are formed. Thereafter, the Si substrate 70 is thinned from the back side. At the time of thinning, the bottom portion of the DTI 82 is simultaneously thinned including the P-type solid phase diffusion layer 83. This thinning is performed up to a depth not reaching the N-type solid phase diffusion layer 84.

Through the above steps, the strong electric field region including the N-type solid phase diffusion layer 84 not in contact with the back surface Si interface 75 and the P-type solid phase diffusion layer 83 in contact with the back surface Si interface 75 can be formed adjacent to the PD 71.

Second Embodiment

Figure 7:
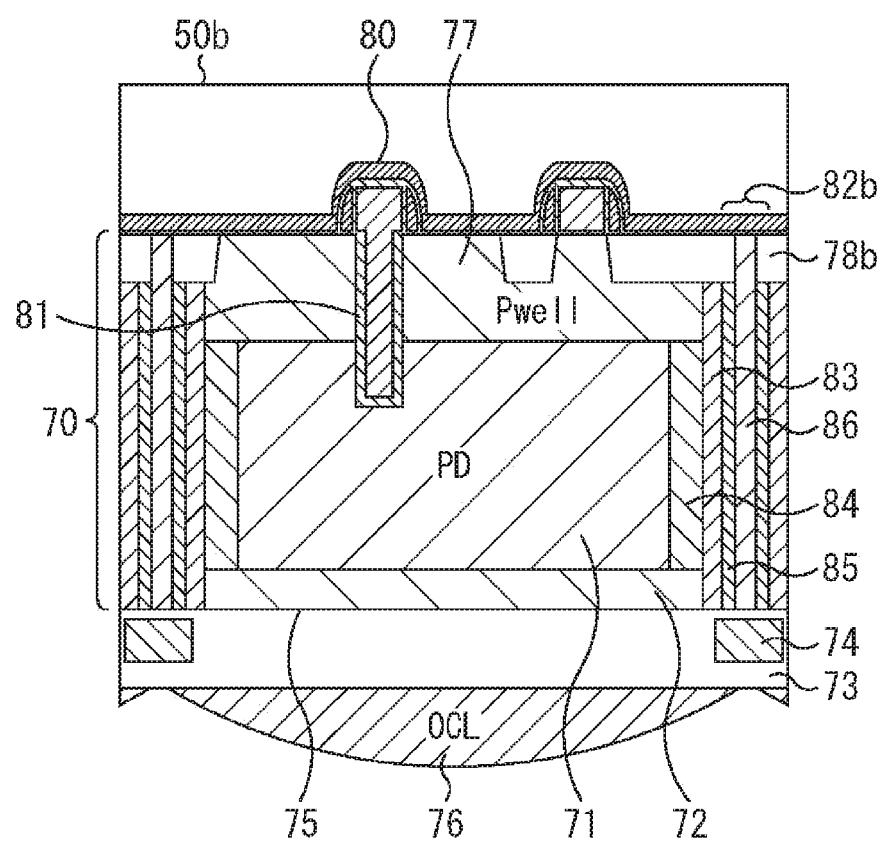
FIG. 7 is a vertical cross-sectional view illustrating a second configuration example of a pixel to which the present technology is applied.

FIG. 7 is a vertical cross-sectional view of a pixel 50*b* in a second embodiment to which the present technology is applied.

The second embodiment is different from the first embodiment in that a DTI 82 is formed in an STI 78 and is similar to the first embodiment in other configurations. The similar portions are denoted by the same reference numerals and description is appropriately omitted. In the following description of the pixel 50, portions of the pixel 50*b*, which are the same as those in the first embodiment, are denoted by the same reference numerals, and description thereof is appropriately omitted.

In the pixel 50*b* illustrated in FIG. 7, an STI 78*b* formed in an active region 77 is formed up to a portion where a DTI 82*b* is formed (formed up to an end portion of the pixel 50*b*). Then, the DTI 82*b* is formed below the STI 78*b*.

In other words, the STI 78*b* is formed at the portion where the DTI 82*b* is formed, and the STI 78*b* and the DTI 82*b* are formed at positions where the STI 78*b* and the DTI 82*b* are in contact with each other.

With such formation, the pixel 50*b* can be downsized as compared with the case where the STI 78*b* and the DTI 82*b* are formed at different positions (for example, the pixel 50*a* (FIG. 3) in the first embodiment).

Furthermore, the pixel 50*b* in the second embodiment can also obtain an effect similar to the pixel 50*a* in the first embodiment, that is, the effect of preventing deterioration of the Dark characteristics.

Third Embodiment

Figure 8:
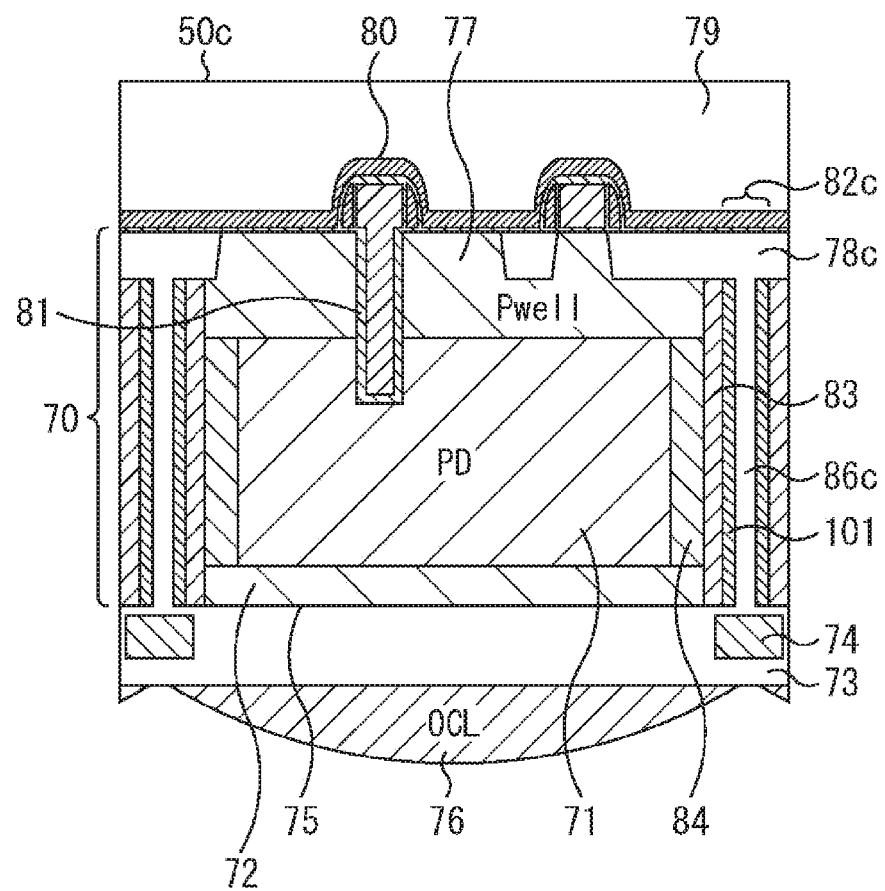
FIG. 8 is a vertical cross-sectional view illustrating a third configuration example of a pixel to which the present technology is applied.

FIG. 8 is a vertical cross-sectional view of a pixel 50*c* in a third embodiment to which the present technology is applied.

The third embodiment is different from the pixels 50*a* and 50*b* in the first and second embodiments in that a film 101 having a negative fixed electric charge is formed on a sidewall of a DTI 82c, and SiO2 is added inside the film 101 as a filler 86c.

The pixel 50a in the first embodiment has the configuration in which the sidewall film 85 using SiO2 is formed on the sidewall of the DTI 82 and polysilicon is added, whereas the pixel 50c in the third embodiment has a configuration in which the film 101 having a negative fixed electric charge is formed on the sidewall of the DTI 82c, and SiO2 is added inside the film 101.

The film 101 having a negative fixed electric charge formed on the sidewall of the DTI 82c can be formed using, for example, a hafnium oxide (HfO2) film, an aluminum oxide (Al2O3) film, a zirconium oxide (ZrO2) film, a tantalum oxide (Ta2O5) film, or a titanium oxide (TiO2) film. The above-described types of films have been used as a gate insulating film of an insulated gate field effect transistor and the like and thus the film forming method has been established. Therefore, the films can be easily formed.

Examples of the film forming method include a chemical vapor deposition method, a sputtering method, and an atomic layer deposition method. In the case of using the atomic layer vapor deposition method, a SiO2 layer that reduces an interface state during film formation can be simultaneously formed to about 1 nm, and thus the method is suitable.

Furthermore, examples of materials other than the above materials include lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), erbium oxide (Er2O3), thulium oxide (Tm2O3), ytterbium oxide (Yb2O3), lutetium oxide (Lu2O3), and yttrium oxide (Y2O3).

Moreover, the film 101 having a negative fixed electric charge can be formed using a hafnium nitride film, an aluminum nitride film, a hafnium oxynitride film, or an aluminum oxynitride film.

The film 101 having a negative fixed electric charge may have silicon (Si) or nitrogen (N) added to the film as long as an insulating property is not impaired. The concentration is appropriately determined within a range not impairing the insulating property of the film. Note that, not to cause image defects such as a white point, the additives such as the above silicon or nitrogen are favorably added to a front surface of the film 101 having a negative fixed electric charge, that is, an opposite surface to the above-described PD 71 side. By adding silicon (Si) or nitrogen (N), as described above, a heat resisting property of the film and an ability to prevent ion implantation during the process can be increased.

In the third embodiment, pinning of the trench sidewall of the DTI 82 can be strengthened. Therefore, for example, the pixel 50c can more reliably prevent deterioration of Dark characteristics than the pixel 50a in the first embodiment, for example.

To form the DTI 82 in the third embodiment, a back side from the state illustrated in D in FIG. 6 is polished until the polysilicon added as the filler 86 is exposed, and then the filler 86 (polysilicon) and a sidewall film 85 (SiO2) inside a groove are removed by photoresist and wet etching, the film 101 is formed, and then the groove is filled with SiO2.

Note that the inside of the groove may be filled with a metal material such as tungsten (W) instead of SiO2 as the filling material. In this case, since light transmission by the DTI 82 with respect to incident light from an oblique direction is suppressed, color mixture can be improved.

Fourth Embodiment

Figure 9:
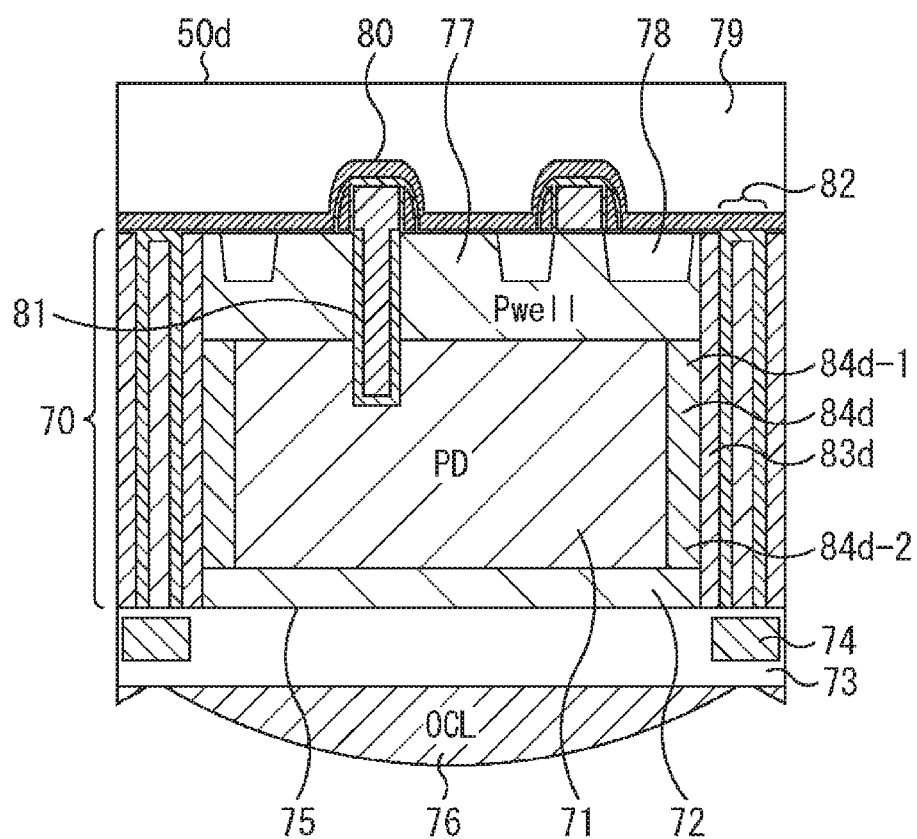
FIG. 9 is a vertical cross-sectional view illustrating a fourth configuration example of a pixel to which the present technology is applied.

FIG. 9 is a vertical cross-sectional view of a pixel 50d in a fourth embodiment to which the present technology is applied.

In the fourth embodiment, the pixel 50d is different from the pixel 50a in the first embodiment in that an N-type solid phase diffusion layer 84d formed along a DTI 82 has a concentration gradient in a depth direction of a Si substrate 70, and is similar to the pixel 50a in the first embodiment in the other configurations.

The concentration of the N-type impurity of the N-type solid phase diffusion layer 84 of the pixel 50a in the first embodiment is constant regardless of the depth direction, whereas the concentration of an N-type impurity of the N-type solid phase diffusion layer 84d of the pixel 50d in the fourth embodiment is different depending on the depth direction.

That is, an N-type solid phase diffusion layer 84d-1 close to a front side of the N-type solid phase diffusion layer 84d of the pixel 50d is formed to have high concentration of the N-type impurity, and an N-type solid phase diffusion layer 84d-2 close to a back side is formed to have low concentration of the N-type impurity.

The pixel 50d in the fourth embodiment has the N-type solid phase diffusion layer 84d having the concentration gradient and thus has a shallow potential on the back side, thereby obtaining a new effect of easily reading electric charges, in addition to an effect similar to that of the pixel 50a in the first embodiment.

To provide the concentration gradient in the N-type solid phase diffusion layer 84d, etching damage occurs in a sidewall of the groove of the DTI 82 when opening the groove, for example. Therefore, the difference in a solid-phase diffusion doping amount depending on a damage amount can be used.

Note that instead of providing the concentration gradient in the N-type solid phase diffusion layer 84d, a P-type impurity concentration of a P-type solid phase diffusion layer 83d close to the front side may be made low, and the P-type impurity concentration of the P-type solid phase diffusion layer 83d close to the back side may be made high. Even in this case, an effect similar to that of the case of the N-type solid phase diffusion layer 84d provided with the concentration gradient can be obtained.

Furthermore, both the N-type solid phase diffusion layer 84d and the P-type solid phase diffusion layer 83d may have concentration gradients.

Fifth Embodiment

Figure 10:
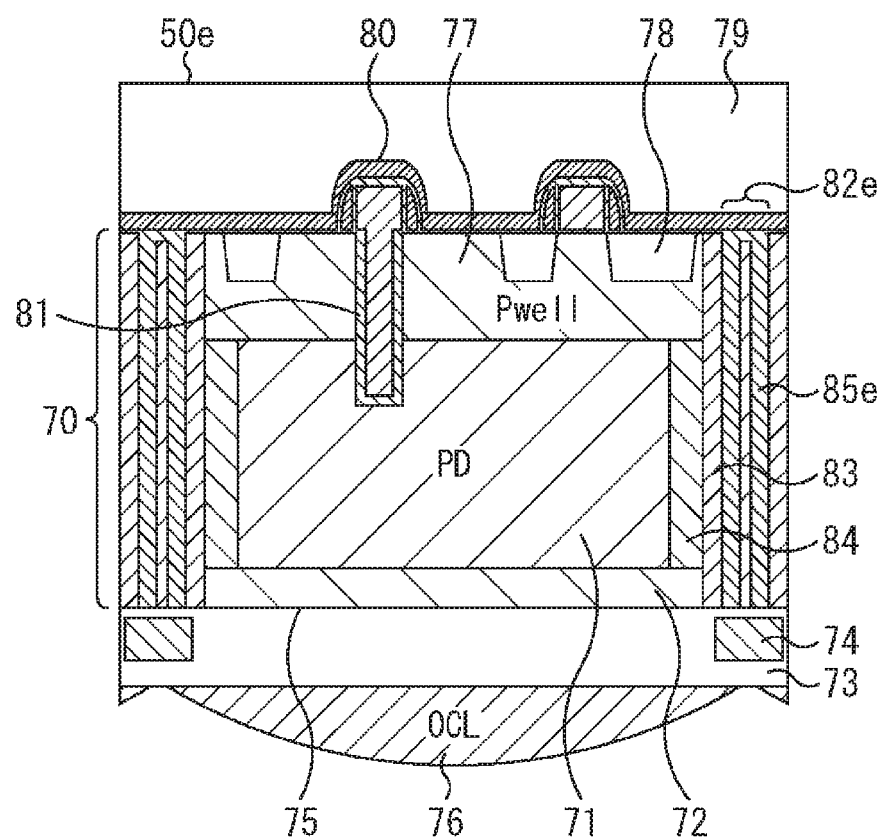
FIG. 10 is a vertical cross-sectional view illustrating a fifth configuration example of a pixel to which the present technology is applied.

FIG. 10 is a vertical cross-sectional view of a pixel 50e in a fifth embodiment to which the present technology is applied.

The pixel 50e in the fifth embodiment is different from the first embodiment in that a sidewall film 85e containing SiO2 formed on an inner wall of a DTI 82e is formed to be thicker than the sidewall film 85 of the pixel 50e in the first embodiment, and is similar to the first embodiment in the other configurations.

Since SiO2 has a lower refractive index of light than that of Si, incident light having entered a Si substrate 70 is reflected according to the Snell's law and transmission of the light through an adjacent pixel 50 is suppressed. If the film thickness of the sidewall film 85 is thin, the Snell' law is not completely established, and transmitted light may increase.

Since the sidewall film 85e of the pixel 50e in the fifth embodiment is formed to be thick in the film thickness, deviation from the Snell's law can be reduced, the reflection of the incident light at the sidewall film 85e increases, and transmission to the adjacent pixel 50e can be reduced. Therefore, the pixel 50e in the fifth embodiment can obtain an effect similar to the pixel 50a in the first embodiment, and can also have an effect of suppressing color mixture to the adjacent pixel 50e caused by oblique incident light.

Sixth Embodiment

Figure 11:
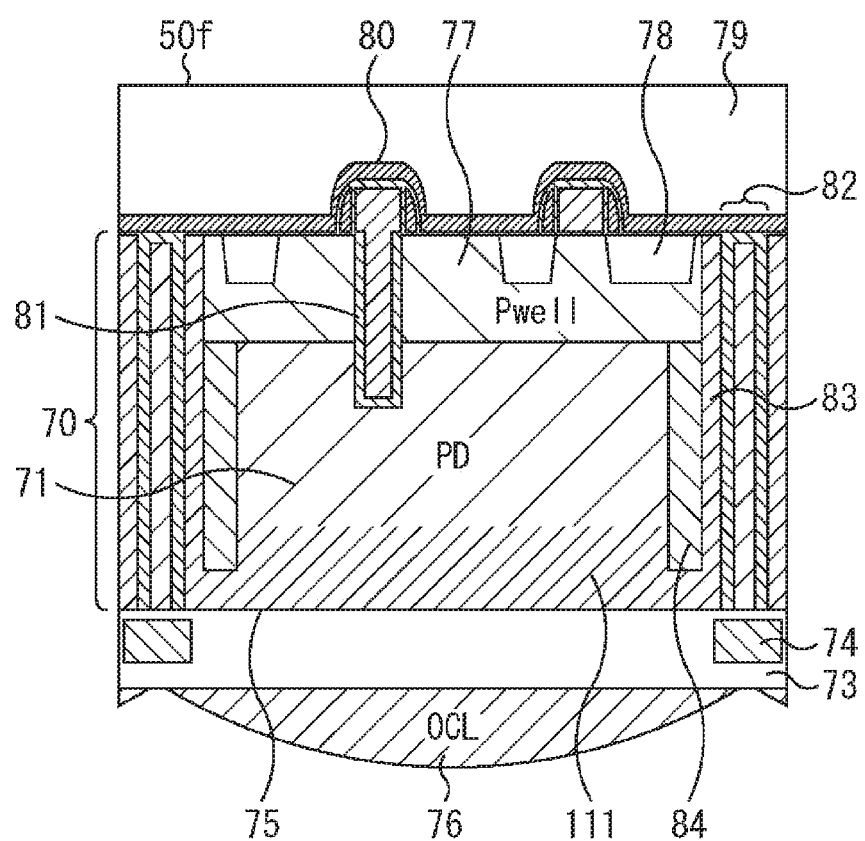
FIG. 11 is a vertical cross-sectional view illustrating a sixth configuration example of a pixel to which the present technology is applied.

FIG. 11 is a vertical cross-sectional view of a pixel 50f in a sixth embodiment to which the present technology is applied.

The pixel 50f in the sixth embodiment is different from the pixel 50a in the first embodiment in that a concentration gradient is provided such that a P-type impurity concentration in a Si substrate 70 is higher on a back side than a front side by doping a region 111 between a PD 71 and a back surface Si interface 75 with a P-type impurity, and the pixel 50f in the sixth embodiment is similar to the pixel 50a in the first embodiment in the other configurations.

Referring FIG. 3 again, the pixel 50a in the first embodiment has no concentration gradient in the Si substrate 70, and the P-type region 72 is formed between the Si substrate 70 and the back surface Si interface 75. The pixel 50f in the sixth embodiment has a concentration gradient in a Si substrate 70. The concentration gradient is a concentration gradient of P-type impurity concentration that is higher on a back side (P-type region 111 side) than a front side.

The pixel 50f in the sixth embodiment having such a concentration gradient can obtain a further effect of more easily reading electric charges than the pixel 50a in the first embodiment, in addition to an effect similar to that of the pixel 50a in the first embodiment.

Seventh Embodiment

Figure 12:
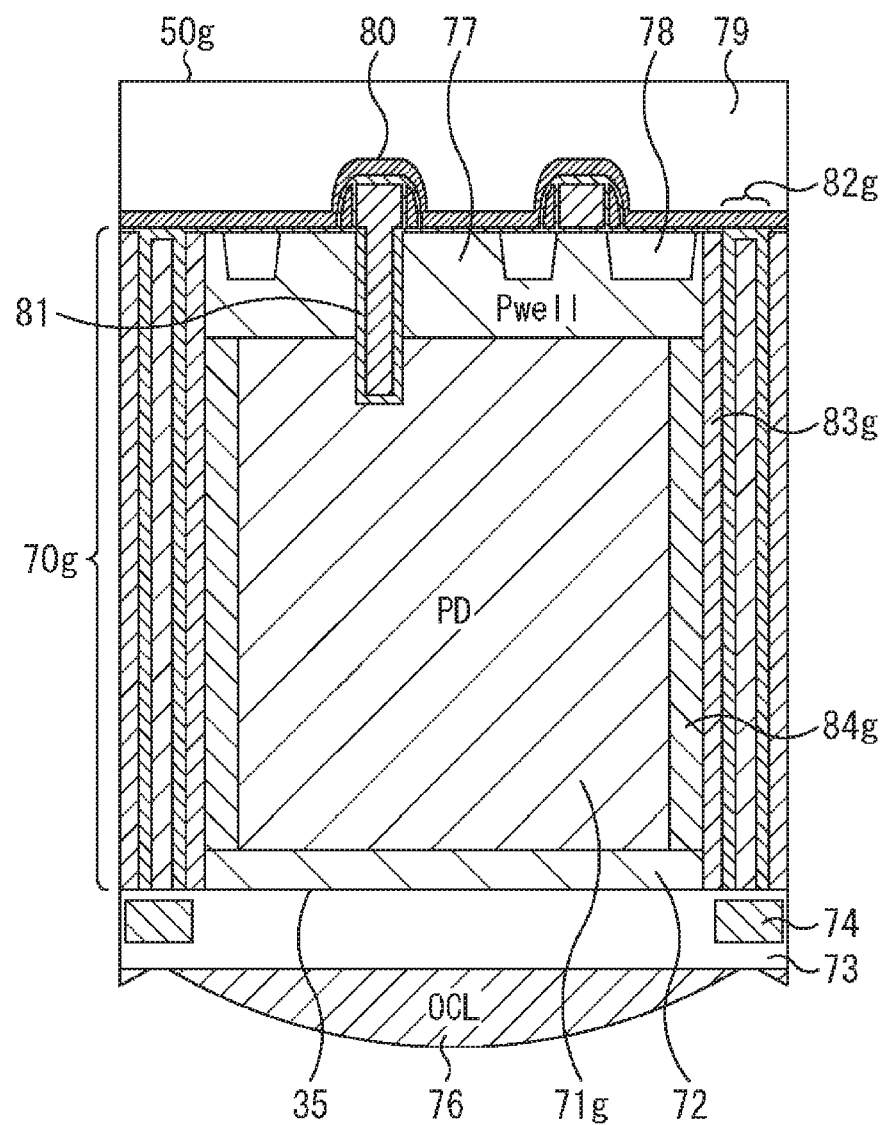
FIG. 12 is a vertical cross-sectional view illustrating a seventh configuration example of a pixel to which the present technology is applied.

FIG. 12 is a vertical cross-sectional view of a pixel 50g in a seventh embodiment to which the present technology is applied.

The pixel 50g in the seventh embodiment is different from the pixel 50a in the first embodiment in that a Si substrate 70 is larger in thickness than that of the pixel 50a, and a DTI 82 and the like are deeply formed with an increase in the thickness of the Si substrate 70.

In the pixel 50g in the seventh embodiment, the Si substrate 70g is formed to be thick. An area (volume) of a PD 71g increases and a DTI 82g is deeply formed with the deep formation of the Si substrate 70g. A P-type solid phase diffusion layer 83g and an N-type solid phase diffusion layer 84g are also formed to be deep (wide) with the deep formation of the DTI 82g.

Since the P-type solid phase diffusion layer 83g and the N-type solid phase diffusion layer 84g are widened, an area of a PN junction region including the P-type solid phase diffusion layer 83g and the N-type solid phase diffusion layer 84g becomes larger. Therefore, the pixel 50g in the seventh embodiment can obtain an effect similar to the pixel 50g in the seventh embodiment, and can further increase a saturated electric charge amount Qs than the pixel 50a in the first embodiment.

Eighth Embodiment

Figure 13:
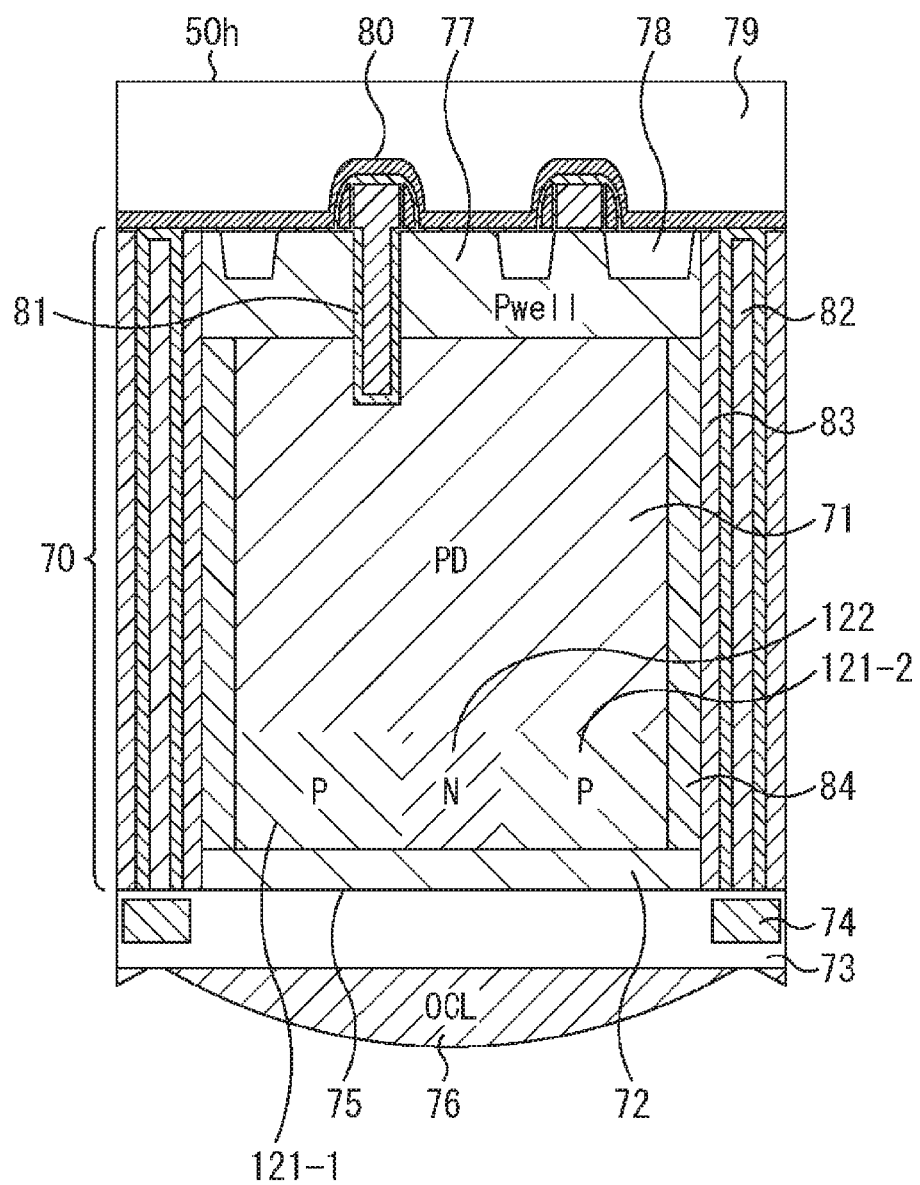
FIG. 13 is a vertical cross-sectional view illustrating an eighth configuration example of a pixel to which the present technology is applied.

FIG. 13 is a vertical cross-sectional view of a pixel 50h in an eighth embodiment to which the present technology is applied.

The pixel 50h in the eighth embodiment is a pixel in which a length in a depth direction of a Si substrate 70g is extended, as in the pixel 50g in the seventh embodiment illustrated in FIG. 12.

Moreover, in the pixel 50r, a P-type region 121-1, an N-type region 122, and a P-type region 121-2 are formed on a back side of a PD 71 by ion implantation. Since a strong electric field is generated in a PN junction portion formed by the P-type region 121-1, the N-type region 122, and the P-type region 121-2, electric charges can be retained.

Therefore, the pixel 50h in the eighth embodiment can obtain an effect similar to that of the pixel 50g in the seventh embodiment, and further increase a saturated electric charge amount Qs.

Ninth Embodiment

Figure 14:
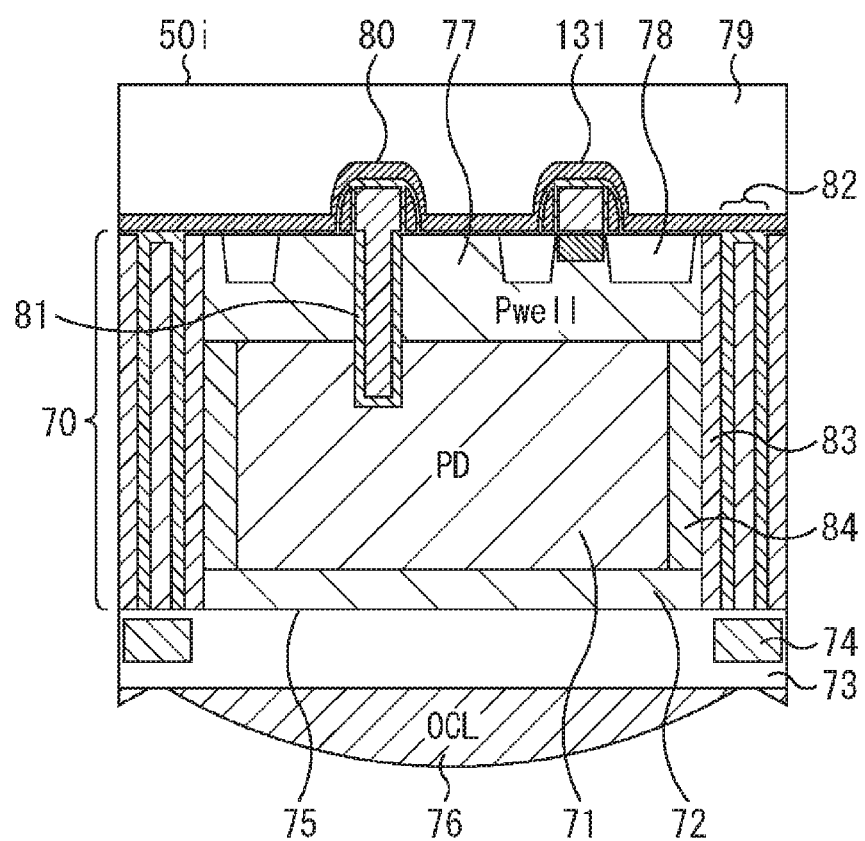
FIG. 14 is a vertical cross-sectional view illustrating a ninth configuration example of a pixel to which the present technology is applied.

FIG. 14 is a vertical cross-sectional view of a pixel 50i in a ninth embodiment to which the present technology is applied.

The pixel 50i in the ninth embodiment is different from the pixel 50a in the first embodiment in that a MOS capacitor 131 and pixel transistors (not illustrated) are formed on a front side of a Si substrate 70, and is similar to the pixel 50a in the first embodiment in the other configurations.

Normally, even if the saturated electric charge amount Qs of a PD 71 is made larger, an output is limited at an amplitude limit of a vertical signal line VSL (vertical signal line 47 illustrated in FIG. 2) unless conversion efficiency is lowered, and it is difficult to make full use of the increased saturated electric charge amount Qs.

To lower the conversion efficiency of the PD 71, it is necessary to add a capacitance to an FD 91 (FIG. 4). Therefore, the pixel 50i in the ninth embodiment has a configuration in which the MOS capacitor 131 is added as a capacitance added to the FD 91 (not illustrated in FIG. 11).

The pixel 50i in the ninth embodiment can obtain an effect similar to the pixel 50a in the first embodiment, and can lower the conversion efficiency of the PD 71 by adding the MOS capacitor 131 to the FD 91 and can make full use of the increased saturated electric charge amount Qs.

Tenth Embodiment

Figure 15:
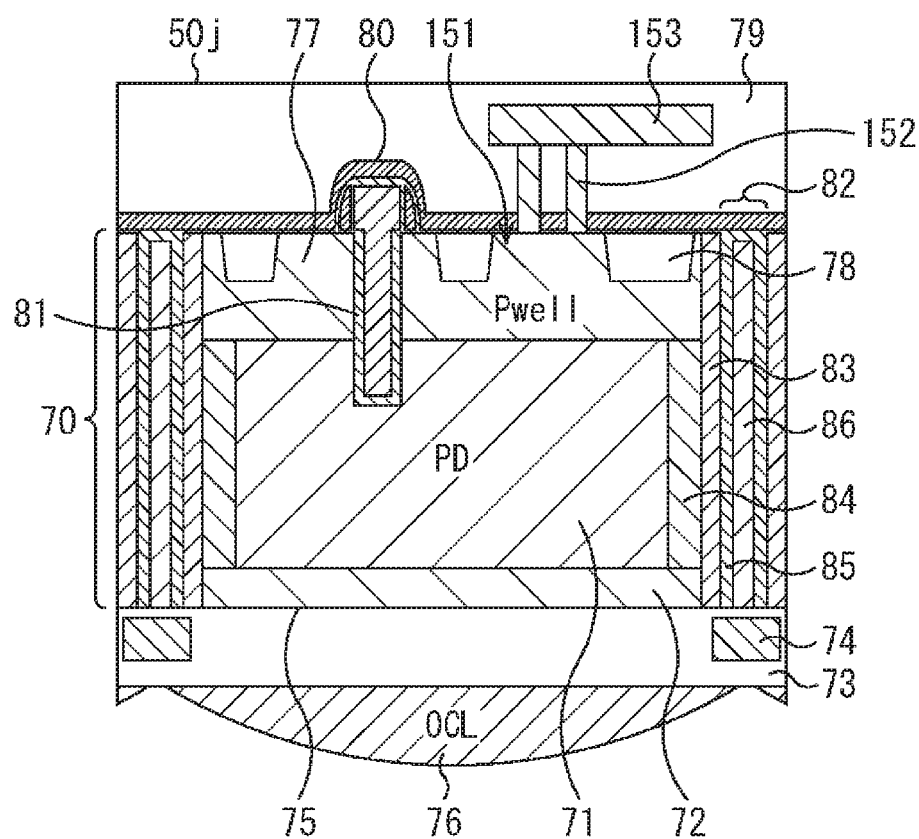
FIG. 15 is a vertical cross-sectional view illustrating a tenth configuration example of a pixel to which the present technology is applied.

FIG. 15 is a vertical cross-sectional view of a pixel 50j in a tenth embodiment to which the present technology is applied.

The pixel 50j in the tenth embodiment is different from the pixel 50a in the first embodiment in that two contacts 152 are formed in a well contact portion 151 formed in an active region 77, and the contacts 152 are connected to Cu wiring 153, and is similar to the pixel 50a in the first embodiment in the other configurations.

The configuration including the well contact portion 151 can be adopted, as described above. Note that FIG. 15 illustrates the example in which the two contacts 152 are formed. However, two or more contacts 152 may be formed in the well contact portion 151.

The pixel 50j in the tenth embodiment can improve a yield of major defects, in addition to obtaining an effect similar to the pixel 50a in the first embodiment.

Eleventh Embodiment

Figure 16:
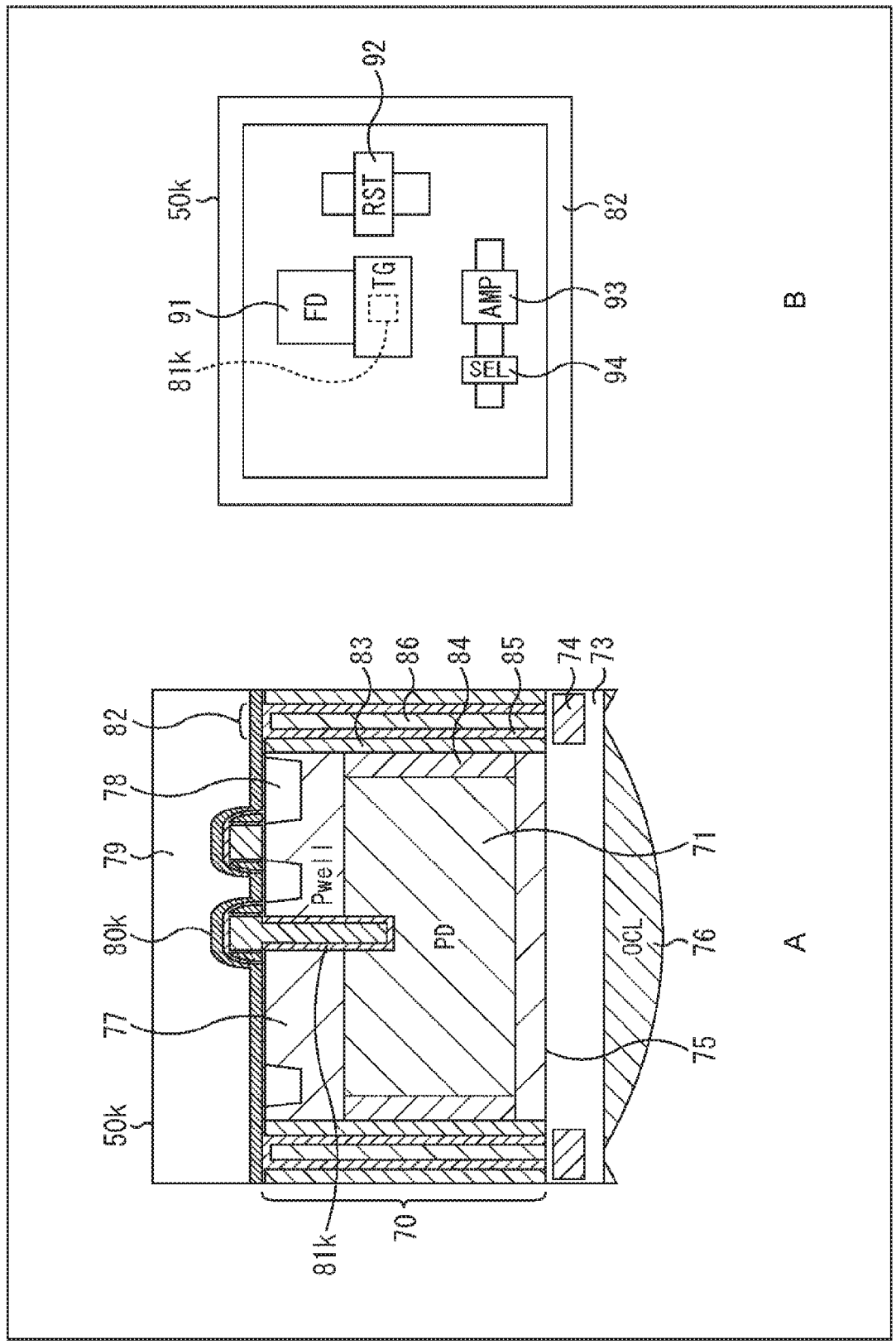
FIG. 16 is a vertical cross-sectional view and a plan view illustrating an eleventh configuration example of a pixel to which the present technology is applied.

FIG. 16 is a vertical cross-sectional view and a plan view of a pixel 50k in an eleventh embodiment to which the present technology is applied.

The pixel 50k in the eleventh embodiment is different from the pixel 50a in the first embodiment in that a vertical transistor trench 81k is opened in a center of the pixel 50k, and a transfer transistor (gate) 80k is formed, and is similar to the pixel 50a in the first embodiment in the other configurations.

The pixel 50k illustrated in FIG. 16 is formed in a state where the transfer transistor (gate) 80K is located at an equal distance from each outer periphery of a PD 71. Therefore, the pixel 50k in the eleventh embodiment can improve transfer of electric charges because the transfer transistor (gate) is present at an equal distance from each outer periphery of the PD 71, in addition to obtaining an effect similar to the pixel 50a in the first embodiment.

Twelfth Embodiment

Figure 17:
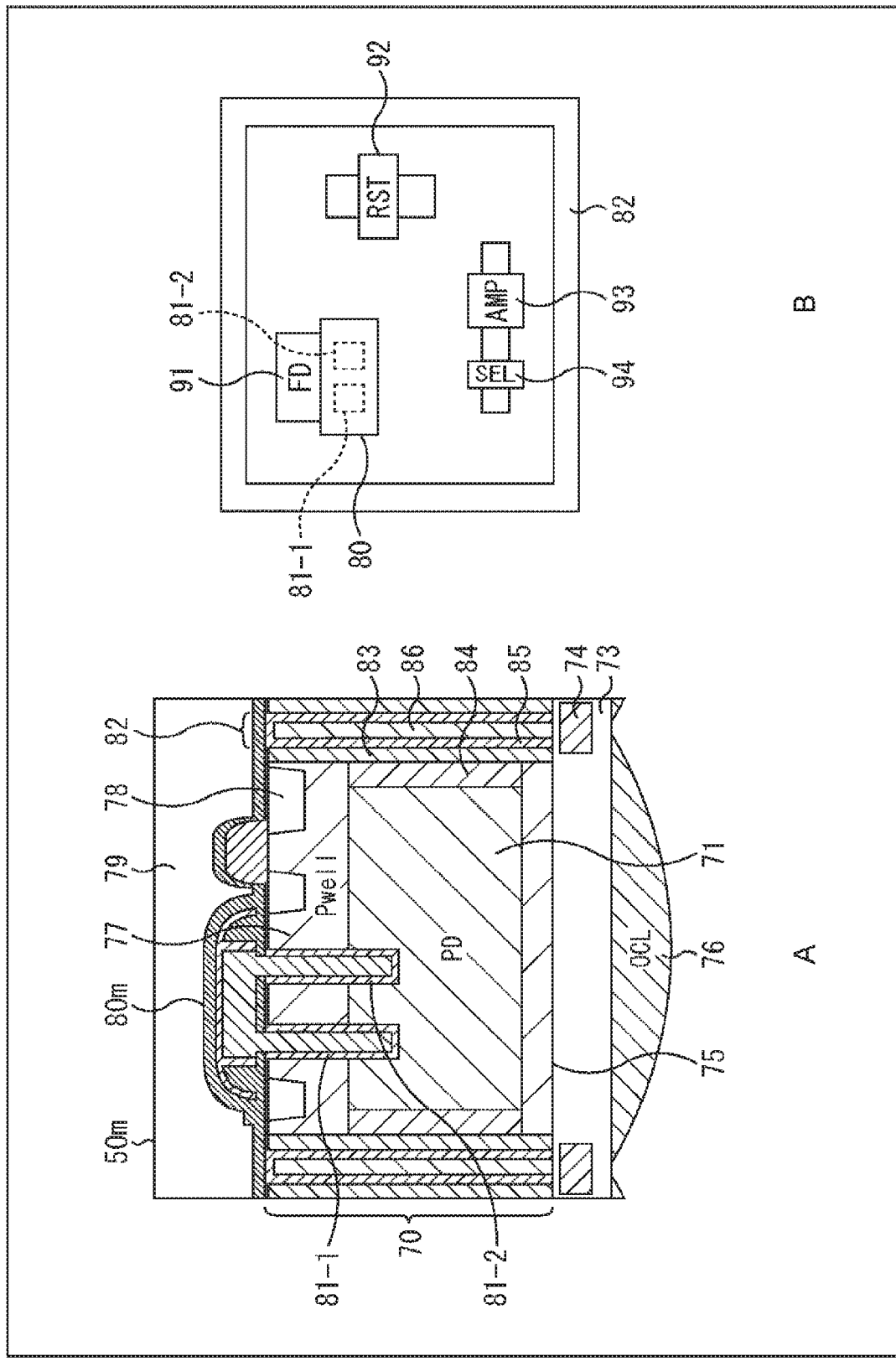
FIG. 17 is a vertical cross-sectional view and a plan view illustrating a twelfth configuration example of a pixel to which the present technology is applied.

FIG. 17 is a vertical cross-sectional view and a plan view of a pixel 50m in a twelfth embodiment to which the present technology is applied.

The pixel 50m in the twelfth embodiment is different from the pixel 50a in the first embodiment in that a transfer transistor 80m is formed using two vertical transistor trenches 81-1 and 81-2, and is similarly configured in the other points.

The pixel 50a (FIG. 3) in the first embodiment has the configuration in which the transfer transistor 80 includes one vertical transistor trench 81, whereas the pixel 50m in the twelfth embodiment has a configuration in which the transfer transistor 80m is formed using the two vertical transistor trenches 81-1 and 81-2.

By adopting the configuration provided with the two vertical transistor trenches 81-1 and 81-2 as described above, trackability of a potential in a region sandwiched by the two vertical transistor trenches 81-1 and 81-2 when the potential of the transfer transistor 80k is changed is improved. Therefore, the degree of modulation can be increased. As a result, electric charge transfer efficiency can be improved.

Furthermore, an effect similar to that of the pixel 50a in the first embodiment can be obtained.

Note that, here, the description has been given using the example in which the transfer transistor 80k includes the two vertical transistor trenches 81-1 and 81-2. However, two or more vertical transistor trenches 81 may be formed in each pixel region.

Furthermore, the example in which the two vertical transistor trenches 81-1 and 81-2 are formed to have the same size (same length and thickness) has been described. However, in the case of forming a plurality of vertical transistor trenches 81, the vertical transistor trenches 81 may be formed to have different sizes. For example, one may be formed to be larger than the other one or one may be formed to be thicker than the other one between the two vertical transistor trenches 81-1 and 81-2.

Thirteenth Embodiment

Figure 18:
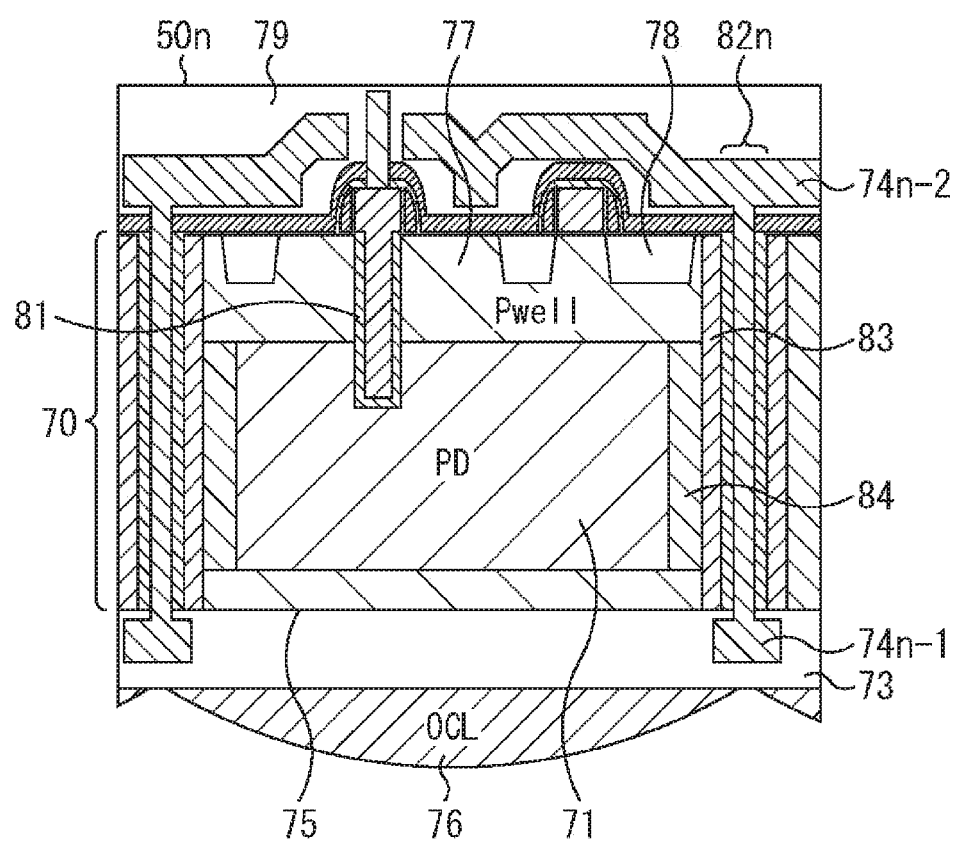
FIG. 18 is a vertical cross-sectional view illustrating a thirteenth configuration example of a pixel to which the present technology is applied.

FIG. 18 is a vertical cross-sectional view of a pixel 50n in a thirteenth embodiment to which the present technology is applied.

The pixel 50n in the thirteenth embodiment is different from the pixel 50a in the first embodiment in a configuration of a light-shielding film 74, and is similar to the pixel 50a in the first embodiment in the other configurations.

In the pixel 50n in the thirteenth embodiment, a light-shielding film 74n-1 and a light-shielding film 74n-2 are formed on an upper side and a lower side of a DTI 82n, respectively. In the pixel 50a (FIG. 3) in the first embodiment, the light-shielding film 74 that covers the back side is formed on the back side (lower side in FIG. 3) of the DTI 82, whereas in the pixel 50n (FIG. 18), the DTI 82n is filled with a metal material (for example, tungsten) that is the same as the light-shielding film 74, and a front side (an upper side in FIG. 18) of a Si substrate 70 is covered with the metal material.

That is, the pixel 50n has a configuration in which each pixel region other than the back surface (other than a light incident surface) is surrounded by the metal material. Note that, in the case of the configuration in which the pixel 50n other than the back surface of the pixel 50n is surrounded by the metal material, an opening is appropriately provided in a necessary portion, such as a portion of the light-shielding film 74n-2 where the transfer transistor 80n is located being opened, and a terminal for connection to an outside being formed.

Note that a metal material other than tungsten (W) may be used for the light-shielding film 74 and the like.

The pixel 50n in the thirteenth embodiment can prevent leakage of incident light to an adjacent pixel 50n and thus can suppress color mixture.

Furthermore, the light having been incident from the back side and having reached a front side without being photoelectrically converted can be reflected by the metal material (light-shielding film 74n-2) and enter the PD 71 again. Therefore, the pixel 50n in the thirteenth embodiment can improve sensitivity of the PD 71 in addition to obtaining an effect similar to the pixel 50a in the first embodiment.

Fourteenth Embodiment

Figure 19:
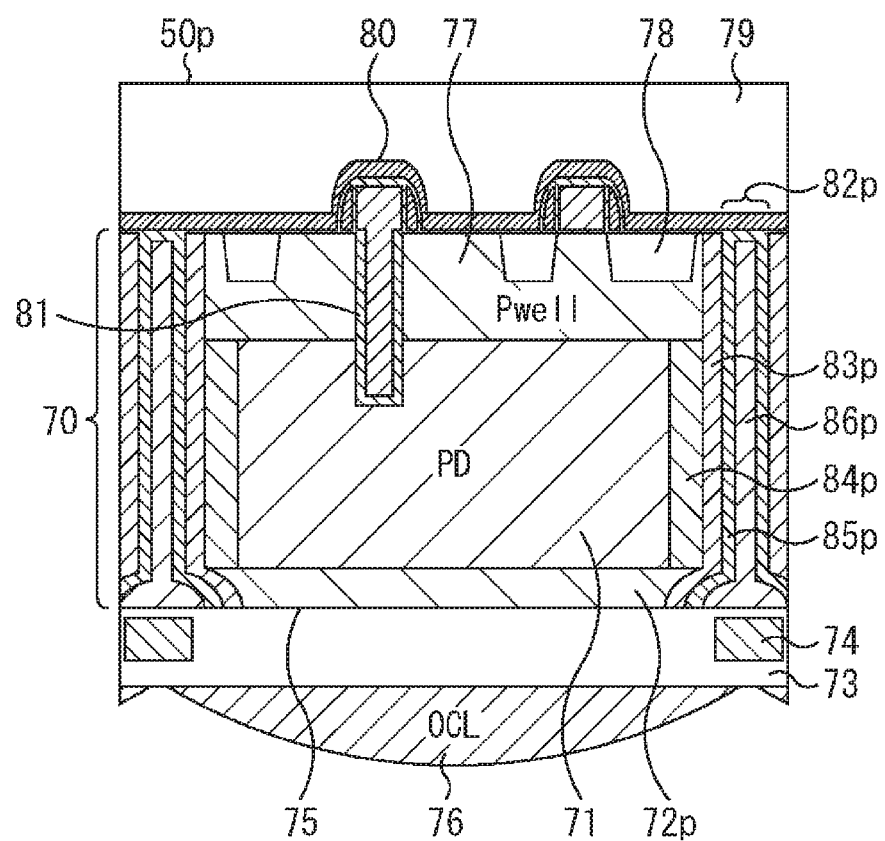
FIG. 19 is a vertical cross-sectional view illustrating a fourteenth configuration example of a pixel to which the present technology is applied.

FIG. 19 is a vertical cross-sectional view of a pixel 50p in a fourteenth embodiment to which the present technology is applied.

The pixel 50p in the fourteenth embodiment is different from the pixel 50a in the first embodiment in that shapes of a P-type solid phase diffusion layer 83p and a sidewall film 85p formed on a back side are different, and is similar to the pixel 50a in the first embodiment in the other configurations.

The P-type solid phase diffusion layer 83p on the back side of the pixel 50p is formed in the shape protruding to a lower side of an N-type solid phase diffusion layer 84p. The pixel 50p has the P-type solid phase diffusion layer 83p formed in the shape protruding into a P-type region 72p in an end portion of the P-type region 72p. Furthermore, the sidewall film 85p formed in the P-type solid phase diffusion layer 83p is also formed in the shape protruding toward the P-type region 72p. Moreover, a filling material 86p formed in the sidewall film 85p is also formed in the shape protruding toward the P-type region 72p.

With such a shape, the N-type solid phase diffusion layer 84p can be reliably not in contact with a back surface Si interface 75 of a Si substrate 70. Therefore, weakening of pinning of electric charges can be prevented, and flowing of the electric charges into a PD 71 and deterioration of Dark characteristics can be prevented.

In forming the N-type solid phase diffusion layer 84p, there is a possibility that the depth and concentration thereof may vary. For example, there is a possibility that the N-type solid phase diffusion layer 84 of an A pixel 50 is formed to be deeper than the N-type solid phase diffusion layer 84 of a B pixel 50. In this case, there is a possibility that the deeply formed N-type solid phase diffusion layer 84 reaches an inside of the P-type region 72 or penetrates the P-type region 72 and reaches the back surface Si interface 75 of the Si substrate 70.

Furthermore, there is also a possibility of variation that the concentration of an N-type impurity of the N-type solid phase diffusion layer 84 of the A pixel 50 is formed to be larger than the concentration of the N-type impurity of the N-type solid phase diffusion layer 84 of the B pixel 50, for example. In this case, there is a possibility that the densely formed N-type solid phase diffusion layer 84 reaches an inside of the P-type region 72 or penetrates the P-type region 72 and reaches the back surface Si interface 75 of the Si substrate 70.

In the pixel 50p, not only the P-type region 72p but also the P-type solid phase diffusion layer 83p is formed in the protruding shape to the lower side of the N-type solid phase diffusion layer 84p on the back surface Si interface 75 side of the N-type solid phase diffusion layer 84p. Therefore, even if variations occur in the depth and concentration of the N-type solid phase diffusion layer 84p, the variations can be reliably absorbed, and the N-type solid phase diffusion layer 84p can be prevented from coming in contact with the back surface Si interface 75 of the Si substrate 70 by the P-type solid phase diffusion layer 83p.

The pixel 50p in the fourteenth embodiment can obtain an effect similar to the pixel 50a in the first embodiment.

<Configuration for Increasing Degree of Freedom Regarding Arrangement of Transistors>

Figure 20:
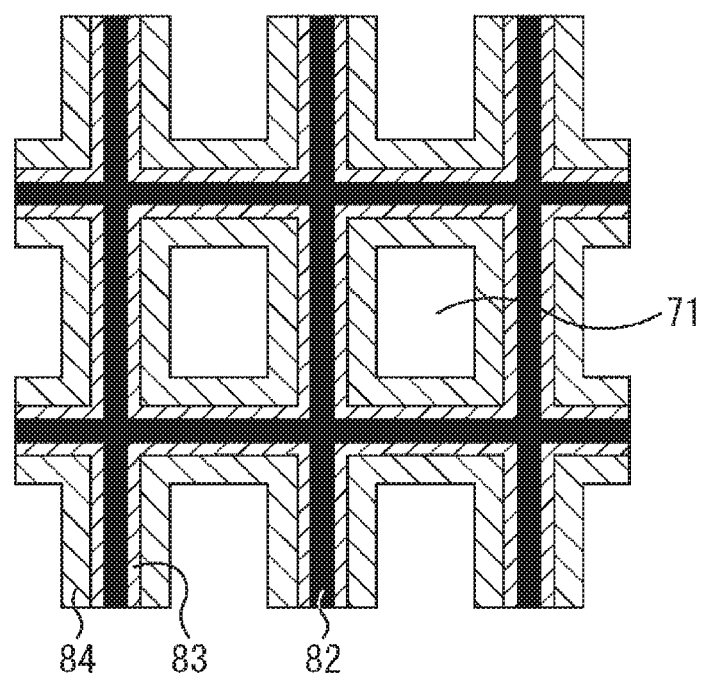
FIG. 20 is a plan view illustrating a configuration example of a pixel to which the present technology is applied.

The pixel 50 in any of the above-described first to fourteenth embodiments is formed to be surrounded by the DTI 82 in plan view, as illustrated in FIG. 20, for example. On the sidewall of the DTI 82, the PN junction region by formation of the P-type solid phase diffusion layer 83 and the N-type solid phase diffusion layer 84 is formed, and this PN junction region forms a strong electric field region. Note that, in the above and following description, it goes without saying that the PN junction region includes a case where the PN junction region is configured only by the P-type solid phase diffusion layer 83 and the N-type solid phase diffusion layer 84, but the PN junction region includes a case where a depletion layer region is present between the P-type solid phase diffusion layer 83 and the N-type solid phase diffusion layer 84.

As illustrated in FIG. 20, the PD 71 is surrounded by the N-type solid phase diffusion layer 84. The N-type solid phase diffusion layer 84 is surrounded by the P-type solid phase diffusion layer 83. Moreover, the P-type solid phase diffusion layer 83 is surrounded by the DTI 82. Furthermore, as described with reference to FIG. 4, the transfer transistor 80, the FD 91, the reset transistor 92, the amplification transistor 93, and the selection transistor 94 are formed in the pixel 50.

When the strong electric field region is formed on the entire surface of the DTI 82, it is necessary to arrange the above-described pixel transistors in the region surrounded by the strong electric field region. For this reason, the degree of freedom in arranging the pixel transistors becomes low, and the region in which the pixel transistors are arranged may be narrowed. Therefore, as described below, by providing a side where the strong electric field region is not formed or a thin portion of the strong electric field region, the region where the pixel transistors are arranged is secured to increase the degree of freedom in arranging the pixel transistors.

Hereinafter, shades of the strong electric field region will be described as fifteenth to eighteenth embodiments. Any one of the fifteenth to eighteenth embodiments can be combined with one of the above-described first to fourteenth embodiments.

Fifteenth Embodiment

Figure 21:
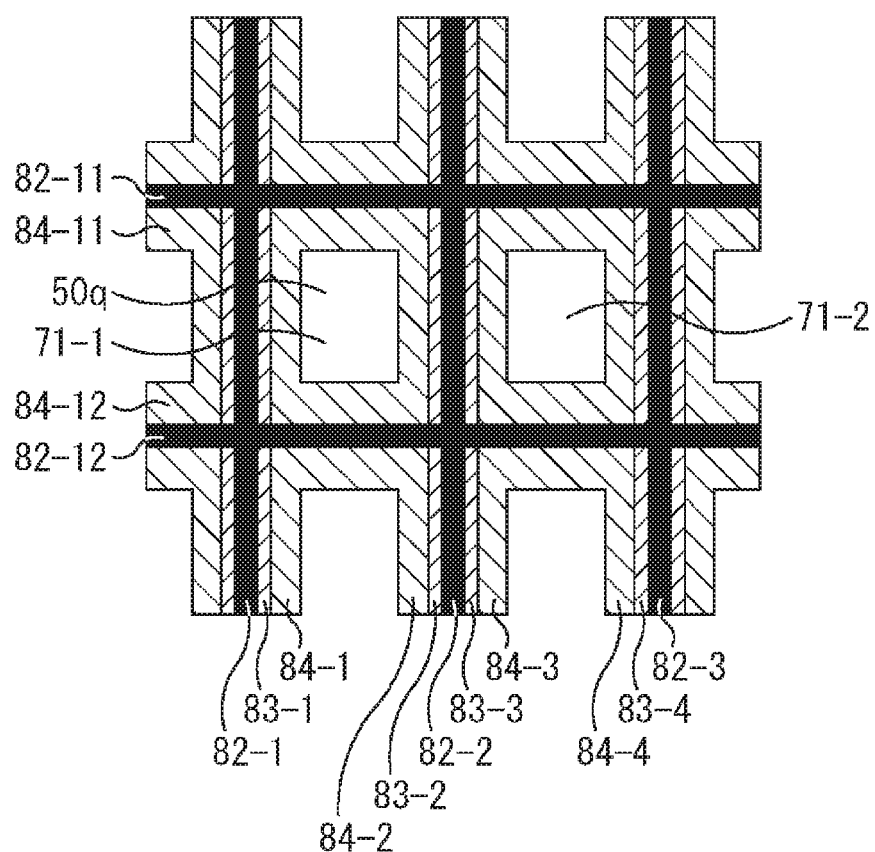
FIG. 21 is a plan view illustrating a fifteenth configuration example of a pixel to which the present technology is applied.

FIG. 21 is a horizontal cross-sectional view (plan view) of a pixel 50q in the fifteenth embodiment to which the present technology is applied.

The pixel 50q in the fifteenth embodiment has a configuration in which a strong electric field region surrounding a PD 71 is not partially formed. When focusing on a PD71-1 included in the pixel 50q by referring to the pixel 50q illustrated in FIG. 21, the strong electric field region is formed on two sides of four sides surrounding the PD 71-1 and the strong electric field region is not formed on the other two sides.

In this case, a P-type solid phase diffusion layer 83-1 and an N-type solid phase diffusion layer 84-1 are formed in a DTI 82-1 on the left side in FIG. 21 of the PD 71-1, and a P-type solid phase diffusion layer 83-2 and an N-type solid phase diffusion layer 84-2 are formed in a DTI 82-2 on the right side in FIG. 21 of the PD 71-1. Therefore, the strong electric field regions are respectively formed on the left side and the right side in FIG. 21 of the PD 71-1.

Meanwhile, in a DTI 82-11 on the upper side in FIG. 21 of the PD71-1, an N-type solid phase diffusion layer 84-11 is formed but the P-type solid phase diffusion layer 83 is not formed. Furthermore, in a DTI 82-12 on the lower side in FIG. 21 of the PD71-1, an N-type solid phase diffusion layer 84-12 is formed but the P-type solid phase diffusion layer 83 is not formed. Therefore, no strong electric field regions are formed on the upper side and the lower side in FIG. 21 of the PD71-1.

By providing the side where the strong electric field region is not formed in this way, (a part of) the pixel transistors can be arranged on the side, and the region where the pixel transistors are arranged is widened and the degree of freedom regarding arrangement of the pixel transistors can be increased.

FIG. 21 illustrates the case where the strong electric field regions (regions where the P-type solid phase diffusion layer 83 and the N-type solid phase diffusion layer 84 are formed) are formed on two sides of four sides of the pixel 50q has been described when focusing on the one pixel 50q. However, the present technology can be applied to a case where the strong electric field region is formed only on one side, or a case where the strong electric field region is formed on three sides, for example.

Figure 22:
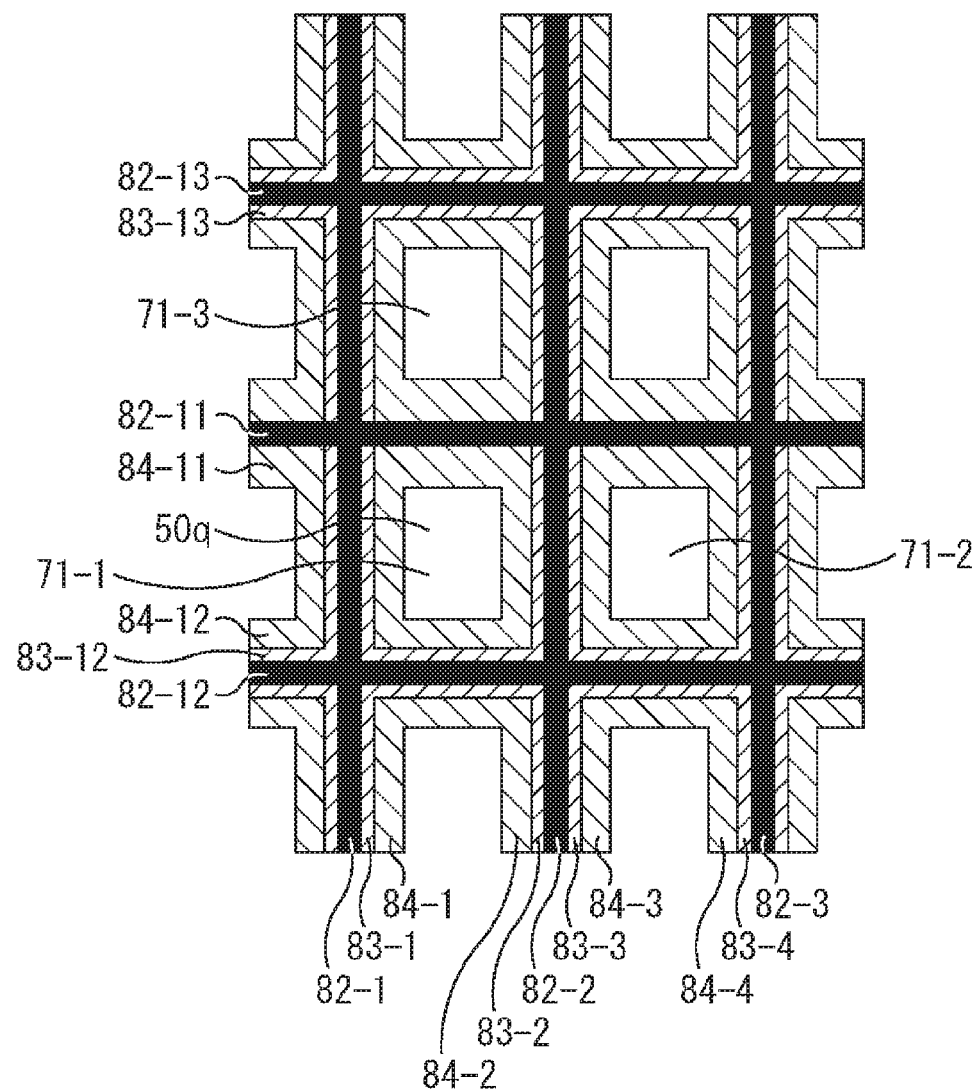
FIG. 22 is a plan view illustrating another fifteenth configuration example of a pixel to which the present technology is applied.

For example, in a case of two-pixel sharing in which a pixel 50q-3 including a PD 71-3 and a pixel 50q-1 including the PD71-1, the pixels 50 being vertically arranged, as illustrated in FIG. 22, share a predetermined transistor, the strong electric field region may not be formed on a side between the pixels that are the sharing pixels, and the strong electric field region may be formed on the other three sides.

The DTI 82-11 between the PD 71-3 and the PD71-1 in the example illustrated in FIG. 22 is a DTI 82-11 where no P-type solid phase diffusion layer 83 is formed, and the pixel transistors can be arranged on or near the DTI 82-11.

Figure 23:
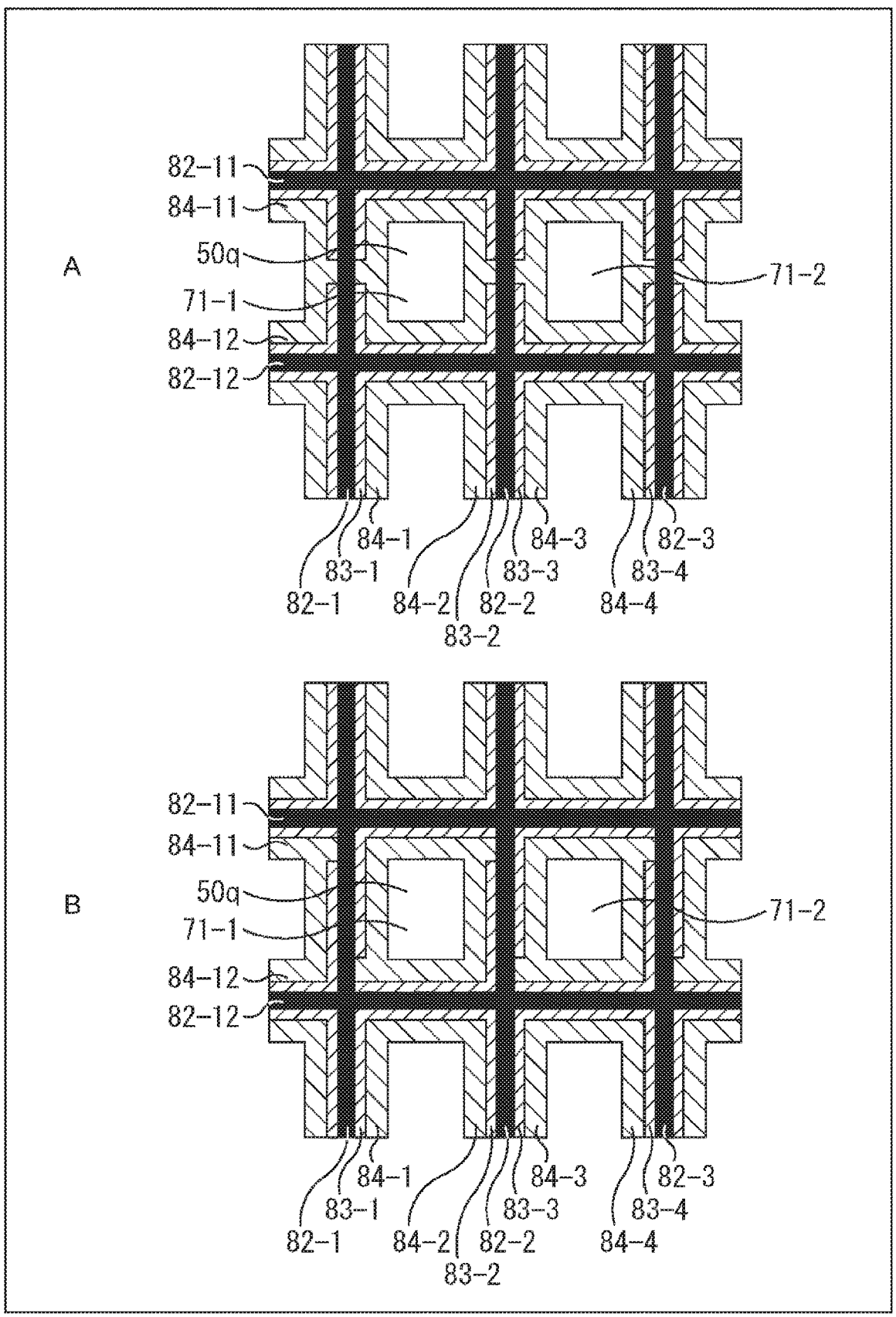
FIG. 23 is a plan view illustrating another fifteenth configuration example of a pixel to which the present technology is applied.

Furthermore, as illustrated in FIG. 23, a configuration in which the P-type solid phase diffusion layer 83 is not formed on a part of the sides of one pixel 50q can be adopted. In the example illustrated in A in FIG. 23, a region having no P-type solid phase diffusion layer 83 is formed near centers of the right side and the left side of the pixel 50q.

For example, the P-type solid phase diffusion layer 83-1 on the left side of the PD 71-1 has an opening formed in a central portion. Furthermore, the P-type solid phase diffusion layer 83-2 on the right side of the PD 71-1 has an opening formed in a central portion. In this way, a portion where the P-type solid phase diffusion layer 83 is not formed (the opening of the P-type solid phase diffusion layer 83) may be provided on a predetermined side.

Furthermore, FIG. 23 illustrates the case where the portion where the P-type solid phase diffusion layer 83 is not formed (opening) is formed on two sides of four sides of the pixel 50*q*. However, the opening may be formed in one side, three sides, or four sides of the four sides.

Furthermore, the openings may be formed at the same position between the adjacent pixels 50*q*, for example, the openings may be formed in the central portions of the sides, as illustrated in A in FIG. 23. Alternatively, the openings may be formed at different positions between the adjacent pixels 50*q*, for example, the opening may be formed in an upper side of the P-type solid phase diffusion layer 83-2 on the right side of the PD71-1, and the opening may be formed in a lower side of the P-type solid phase diffusion layer 83-3 on the left side of the PD 71-2, as illustrated in B in FIG. 23.

Furthermore, the number of the openings formed in one side may be one or plural. Furthermore, the size of one opening can be appropriately set according to the size of a transistor to be arranged or the like.

A method of manufacturing the strong electric field region in the case of providing a region where the P-type solid phase diffusion layer 83 is formed and a region where the P-type solid phase diffusion layer 83 is not formed in the sidewall of the DTI 82 will be described with reference to FIGS. 24 and 25.

In step S51 (FIG. 24), a substrate for forming the DTI 82 is prepared. A silicon oxide film 200 is formed on the substrate, and an insulating film (insulating material) 201 is embedded in a formed groove. LP-TEOS is deposited as the silicon oxide film 200, for example.

In step S52, a part of the silicon oxide film 200, a part of the insulating film 201, a part of SiN, and a part of the Si substrate 70 are dug by dry etching. By step S52, a deep groove (deep trench) is formed. The shape of the deep trench is a lattice shape, for example, as illustrated in FIG. 21 in plan view, and the depth of the deep trench is set to a lower end of a region where the N-type region is to be formed by solid phase diffusion in a subsequent step.

In step S53, a silicon oxide film (PSG) 202 containing phosphorus (P) is deposited on the entire surface of a wafer, using an atomic layer deposition (ALD) method. The PSG film 202 is formed on a front surface of the wafer in which the deep trench is not formed, a side surface of the deep trench, and a bottom surface of the deep trench by the processing in step S53. Since phosphorus (P) is used here, the PSG film 202 is formed as an N-type film.

In step S54, thermal diffusion processing is executed. In step S54, the wafer is annealed, so that phosphorus (P) is solid-phase diffused from the PSG film 202 to the Si substrate 70 in the region where the PSG film 202 and the Si substrate 70 are in contact with each other. As a result, an N-type impurity region 203 is formed as illustrated in step S54 in FIG. 20. The N-type impurity region 203 is a region to serve as the N-type solid phase diffusion layer 84.

In step S55, the PSG film 202 on the wafer is removed. The removal of the PSG film 202 can be performed by, for example, wet etching using hydrofluoric acid.

In step S56 (FIG. 21), silicon on the bottom surface of the deep trench of the wafer is further dug by dry etching.

In step S57, a silicon oxide film (BSG) 204 containing boron (B) is deposited on the entire surface of the wafer, using the ALD method. The BSG film 204 is formed on a front surface of the wafer in which the deep trench is not formed, a side surface of the deep trench, and a bottom surface of the deep trench by the processing in step S54. Since phosphorus (B) is used here, the BSG film 204 is formed as a P-type film.

The BSG film 204 is a portion to become the P-type impurity region and the P-type solid phase diffusion layer 83 by execution of the thermal diffusion processing in subsequent processing. In the case of providing a portion where the P-type solid phase diffusion layer 83 is formed and a portion where the P-type solid phase diffusion layer 83 is not formed, the thermal diffusion processing is performed after the processing in steps S58 to S60 is performed.

Figure 25:
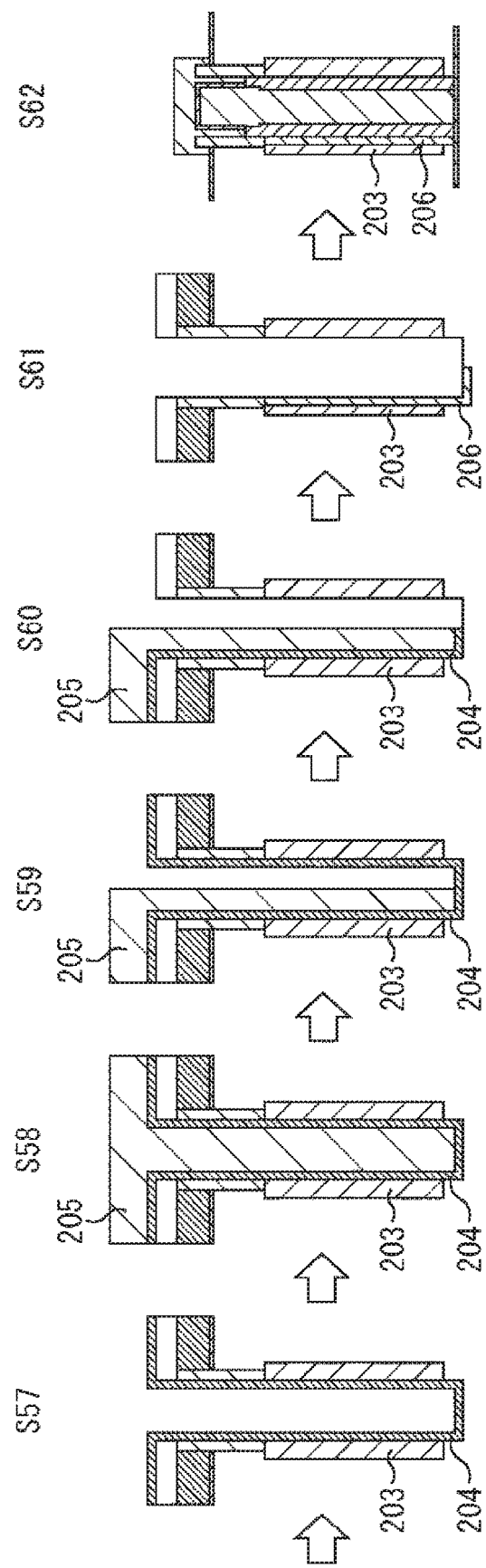
FIG. 25 is a view for describing manufacture of a pixel to which the present technology is applied.

In and after step S58, description will be continued on the assumption that the left side in FIG. 25 is a portion (side) where the P-type solid phase diffusion layer 83 is formed, and the right side in FIG. 25 is a portion (side) where the P-type solid phase diffusion layer 83 is not formed.

In step S58, a resist 205 is applied to the entire surface of the wafer. The resist 205 is formed on the surface of the wafer and is added in the deep trench.

In step S59, the resist 205 applied to the portion corresponding to the portion where the P-type solid phase diffusion layer 83 is not formed is removed. For example, the resist 205 applied to the portion corresponding to the portion where the P-type solid phase diffusion layer 83 is not formed is removed by masking the resist 205 applied to the portion corresponding to the portion where the P-type solid phase diffusion layer 83 is not formed, exposing the mask with light, and peeling the mask. In step S59, processing of leaving the resist 205 applied to the portion corresponding to the portion where the P-type solid phase diffusion layer 83 is to be formed is performed.

In step S60, the BSG film 204 in the opening (the portion where the resist 205 has been removed in step S59) of the resist 205 on the wafer is removed. For example, the BSG film 204 is removed by wet etching using hydrofluoric acid. After the BSG film 204 is removed, the remaining resist 205 is also peeled.

In step S61, the thermal diffusion processing is executed. In step S61, the wafer is annealed, so that boron (B) is solid-phase diffused from the BSG film 204 to the Si substrate 70 in the region where the BSG film 204 and the Si substrate 70 are in contact with each other. As a result, as illustrated in step S61 in FIG. 25, a P-type impurity region 206 is formed. The P-type impurity region 206 is a region to serve as the P-type solid phase diffusion layer 83.

Furthermore, in step S61, the BSG film 204 is removed. The removal of the BSG film 204 can be performed by, for example, wet etching using hydrofluoric acid, as in step S60.

In step S62, polysilicon is embedded as the filling material 86 in the trench, and unnecessary polysilicon deposited on the upper surface of the wafer is removed. Furthermore, the pixel transistors, wiring, and the like are also formed. Thereafter, the Si substrate 70 is thinned from the back side. This thinning is performed until the bottom of the deep trench is exposed.

In this manner, the pixel 50*q* in which the portion where the P-type solid phase diffusion layer 83 is formed and the portion where the P-type solid phase diffusion layer 83 is not formed are mixed, as illustrated in FIGS. 21 to 23, is formed. The pixel 50*q* formed as described above can have a configuration in which the N-type solid phase diffusion layer 84 is not in contact with the back surface Si interface 75 of the Si substrate 70, weakening of pinning of electric charges can be prevented, and flowing of the electric charge into the PD 71 and deterioration of Dark characteristics can be prevented. Furthermore, the arrangement region for transistors can be made large, and the degree of freedom regarding arrangement of the transistors can be increased.

Sixteenth Embodiment

Figure 26:
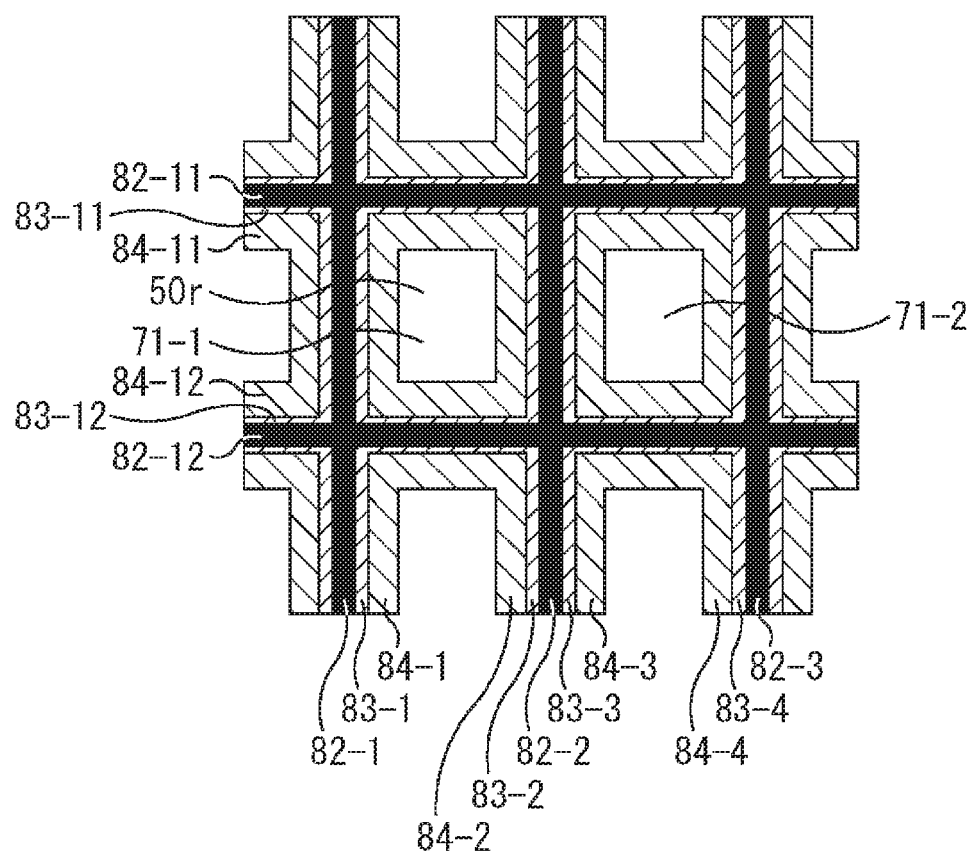
FIG. 26 is a plan view illustrating a sixteenth configuration example of a pixel to which the present technology is applied.

FIG. 26 is a plan view of a pixel 50r in a sixteenth embodiment to which the present technology is applied.

The pixel 50r in the sixteenth embodiment has a configuration in which a strong electric field region surrounding a PD 71 is partially thinned. When focusing on a PD71-1 included in the pixel 50r by referring to the pixel 50r illustrated in FIG. 26, strong electric field regions are formed on four sides surrounding the PD71-1, but a P-type solid phase diffusion layer 83 formed on upper and lower two sides is formed to be thinner than the P-type solid phase diffusion layer 83 formed on right and left two sides.

In this case, a P-type solid phase diffusion layer 83-1 and an N-type solid phase diffusion layer 84-1 are formed in a DTI 82-1 on the left side in FIG. 26 of the PD 71-1, and a P-type solid phase diffusion layer 83-2 and an N-type solid phase diffusion layer 84-2 are formed in a DTI 82-2 on the right side in FIG. 26 of the PD 71-1. Therefore, a strong electric field regions are respectively formed on the left side and the right side in FIG. 26 of the PD 71-1.

Meanwhile, in a DTI 82-11 on the upper side in FIG. 26 of the PD71-1, a P-type solid phase diffusion layer 83-11 and an N-type solid phase diffusion layer 84-11 are formed but the P-type solid phase diffusion layer 83-11 is thinly formed. Furthermore, in a DTI 82-12 on the lower side in FIG. 26 of the PD71-1, a P-type solid phase diffusion layer 83-12 and an N-type solid phase diffusion layer 84-12 are formed but the P-type solid phase diffusion layer 83-12 is thinly formed.

The N-type solid phase diffusion layers 84-1, 84-2, 84-11, and 84-12 formed on four sides of the PD71-1 are formed to have substantially the same thickness.

The P-type solid phase diffusion layers 83-1 and 83-2 are formed to have substantially the same thickness, and the P-type solid phase diffusion layers 83-11 and 83-12 are formed to have substantially the same thickness, among the P-type solid phase diffusion layers 83-1, 83-2, 83-11, and 83-12 formed on four sides of the PD71-1. Furthermore, the P-type solid phase diffusion layers 83-11 and 83-12 are formed to be thinner than the P-type solid phase diffusion layers 83-1 and 83-2.

Note that the thickness being thick or the thickness being thin means that the width of a solid phase diffusion layer is thick or thin in physical magnitude and also means that the N-type or P-type impurity concentration is high or low. The following description will be continued on the assumption that the thickness being thick can be rephrased with the impurity concentration being high, and the thickness being thin can be rephrased with the impurity concentration being low.

By providing the side where the strong electric field region is thin in this way, (a part of) the pixel transistors can be arranged on the side, and the region where the pixel transistors are arranged is widened and the degree of freedom regarding arrangement of the pixel transistors can be increased.

FIG. 26 illustrates the case where the strong electric field region is formed to be thin (the P-type solid phase diffusion layer 83 is thin) on two sides of the four sides of the pixel 50r when focusing on one pixel 50r. However, the present technology can be applied to a case where the strong electric field region is formed to be thin on one side or on three sides, for example.

For example, although not illustrated, in a case of two-pixel sharing in which vertically arranged pixels 50r share a predetermined transistor, as in the pixels 50p illustrated in FIG. 22, the strong electric field region thinner than the other sides may be formed on a side between the pixels that are the sharing pixels.

Figure 27:
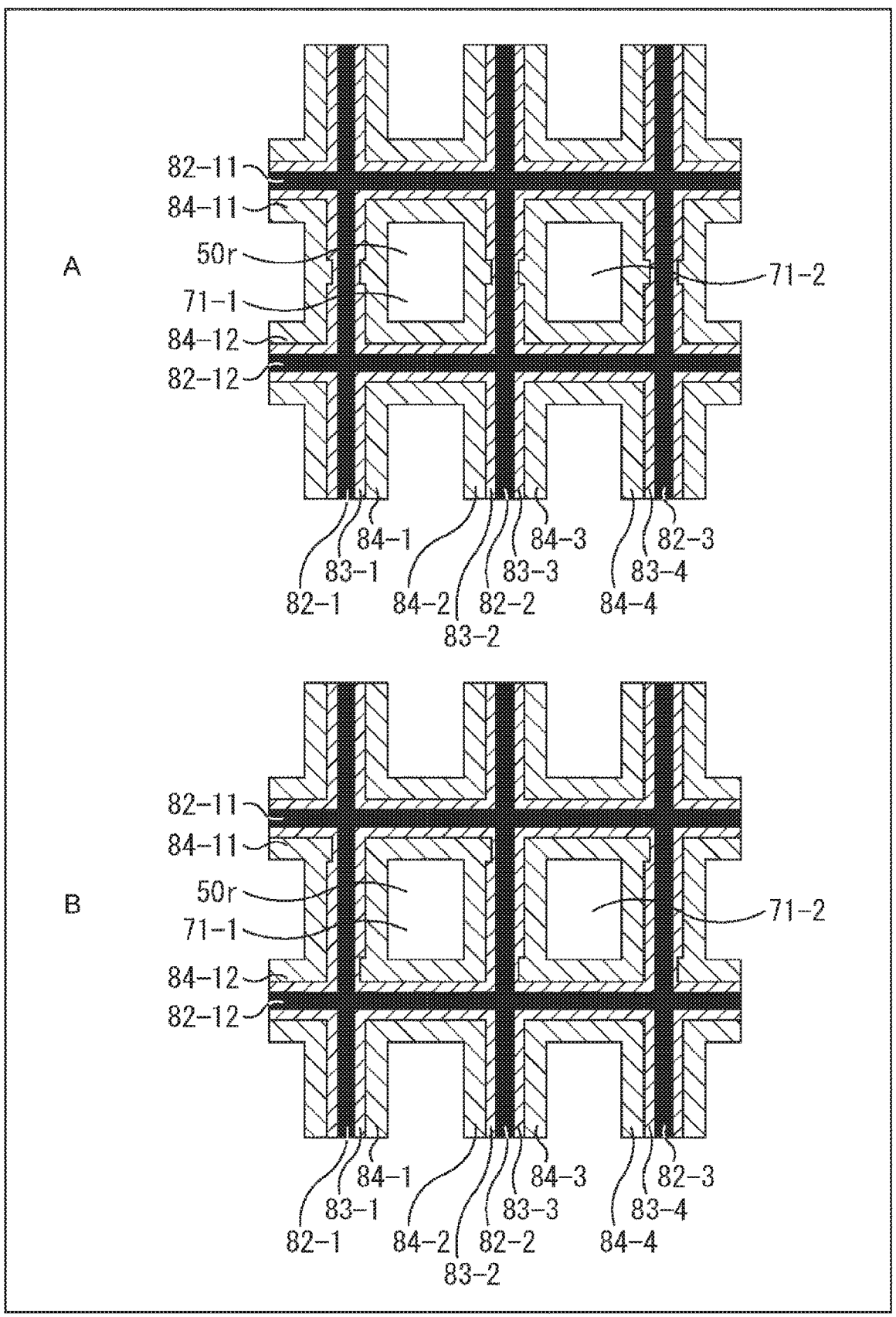
FIG. 27 is a plan view illustrating another sixteenth configuration example of a pixel to which the present technology is applied.

Furthermore, as illustrated in FIG. 27, a configuration in which the P-type solid phase diffusion layer 83 is thinly formed on a part of sides of one pixel 50r can be adopted. In the example illustrated in A in FIG. 27, a region where the P-type solid phase diffusion layer 83 is thinly formed is provided near centers of right side and left side of the pixel 50r. The region where the P-type solid phase diffusion layer 83 is thinly formed is described as depression.

For example, the P-type solid phase diffusion layer 83-1 on the left side of the PD 71-1 has a depression formed in a central portion. Furthermore, the P-type solid phase diffusion layer 83-2 on the right side of the PD 71-1 has a depression formed in a central portion. In this way, a portion where the P-type solid phase diffusion layer 83 is thinly formed (the depression of the P-type solid phase diffusion layer 83) may be provided on a predetermined side.

Furthermore, FIG. 27 illustrates the case where the portion where the P-type solid phase diffusion layer 83 is thinly formed (depression) is formed on two sides of four sides of the pixel 50r. However, the depression may be formed in one side, three sides, or four sides of the four sides.

Furthermore, the depressions may be formed at the same position between the adjacent pixels 50r, for example, the depressions may be formed in the central portions of the sides, as illustrated in A in FIG. 27. Alternatively, the depressions may be formed at different positions between the adjacent pixels 50r, for example, the depression may be formed in an upper side of the P-type solid phase diffusion layer 83-2 on the right side of the PD71-1, and the depression may be formed in a lower side of the P-type solid phase diffusion layer 83-3 on the left side of the PD 71-2, as illustrated in B in FIG. 27.

Furthermore, the number of the depressions formed in one side may be one or plural. Furthermore, the size of one depression can be appropriately set according to the size of a transistor to be arranged, for example.

A method of manufacturing the strong electric field region in the case of providing a region where the P-type solid phase diffusion layer 83 is formed to be thinner than a predetermined thickness and a region where the P-type solid phase diffusion layer 83 is formed to have the predetermined thickness in a sidewall of the DTI 82 will be described with reference to FIGS. 28 and 29.

The flow of forming the P-type solid phase diffusion layer 83 after forming the N-type solid phase diffusion layer 84 on the side surface of the DTI 82 is similar to the flow of manufacturing the pixel 50q of the fifteenth embodiment. The processing up to the formation of the N-type solid phase diffusion layer 84 is similar to the processing of manufacturing the pixel 50q of the fifteenth embodiment, and therefore description thereof is omitted.

Figure 24:
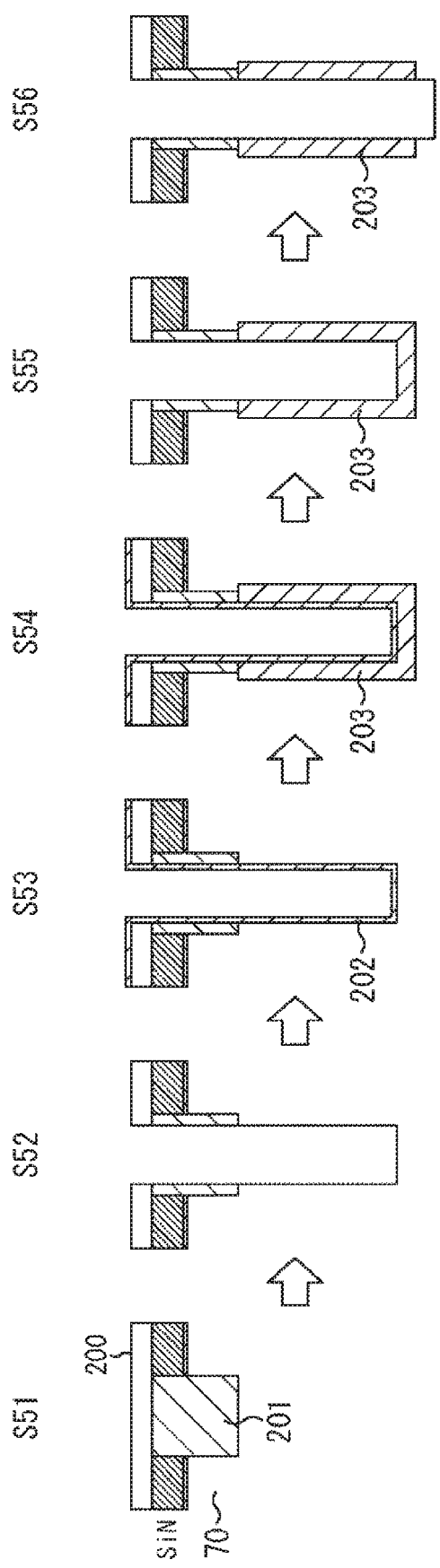
FIG. 24 is a view for describing manufacture of a pixel to which the present technology is applied.

The N-type impurity region 203 to serve as the N-type solid phase diffusion layer 84 is formed on the side surface of the DTI 82 by execution of the processing in steps S51 to S56 illustrated in FIG. 24. When the N-type impurity region 203 is formed, a resist 301 is applied to the entire surface of a wafer in step S101 (FIG. 28). The resist 301 is formed on the front surface of the wafer and is added in the deep trench.

Figure 28:
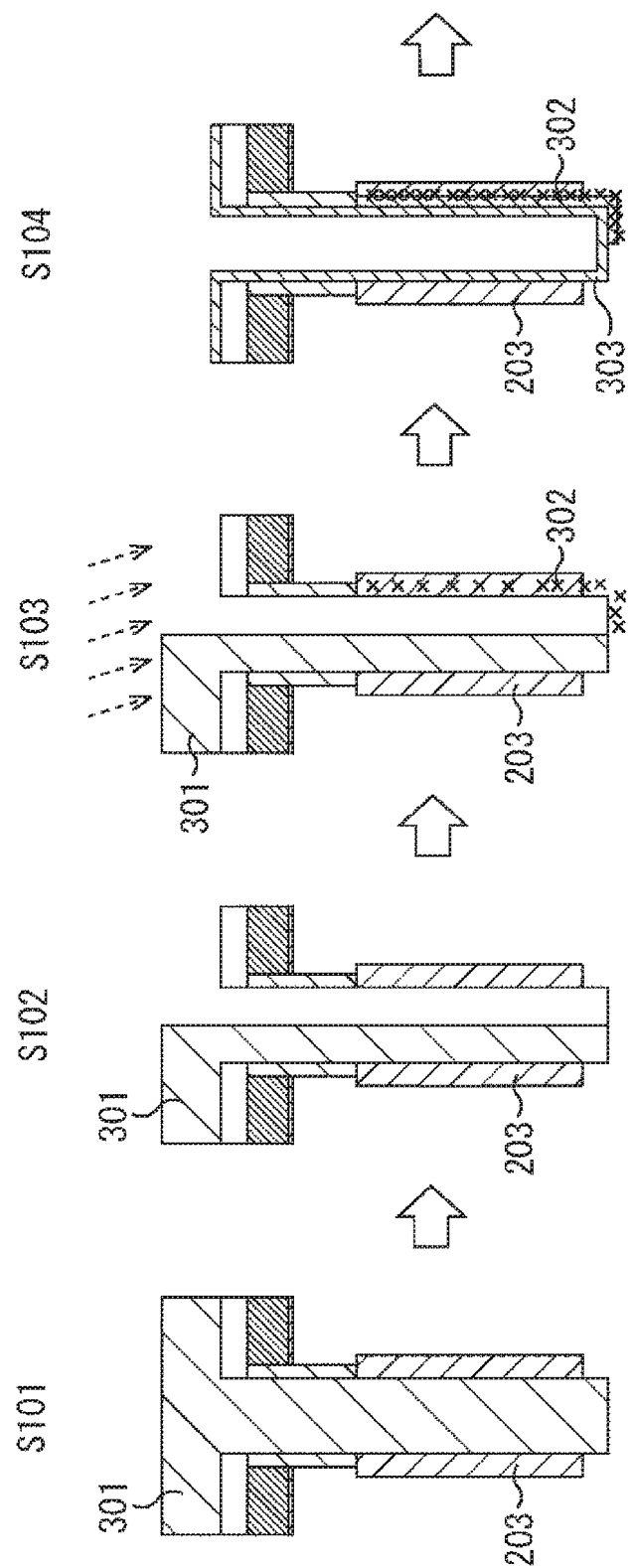
FIG. 28 is a view for describing manufacture of a pixel to which the present technology is applied.
Figure 29:
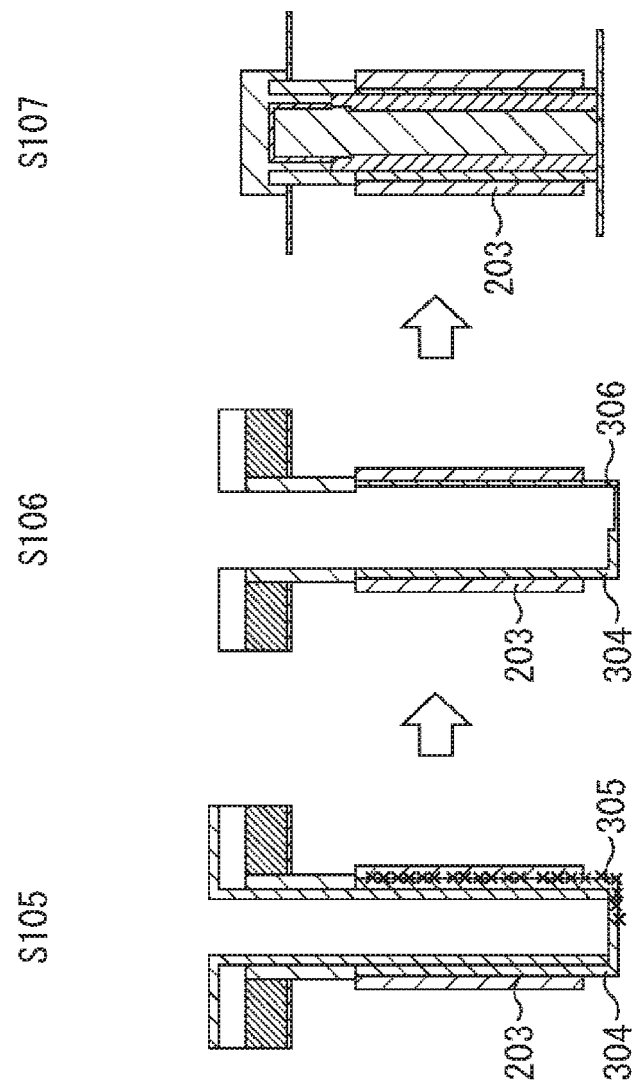
FIG. 29 is a view for describing manufacture of a pixel to which the present technology is applied.

In and after step S101, description will be continued on the assumption that the left side in FIG. 28 is a portion (side) where the P-type solid phase diffusion layer 83 is formed to have the predetermined thickness, and the right side in FIG. 28 is a portion (side) where the P-type solid phase diffusion layer 83 is formed to be thinner than the predetermined thickness.

In step S102, the resist 301 applied to the portion corresponding to the portion where the P-type solid phase diffusion layer 83 is thinly formed is removed. For example, the resist 301 applied to the portion corresponding to the portion where the P-type solid phase diffusion layer 83 is thinly formed is removed by masking the resist 301 applied to the portion corresponding to the portion where the P-type solid phase diffusion layer 83 is thinly formed, exposing the mask with light, and peeling the mask. In step S59, processing of leaving the resist 301 applied to the portion corresponding to the portion where the P-type solid phase diffusion layer 83 is to be formed is performed.

In step S103, ion implantation using P-type ions, for example, phosphorus (P), is performed on the wafer from a diagonal direction. By performing the implantation from the oblique direction, the portion without the resist 301 can be damaged by the implantation. As illustrated in step S103 in FIG. 28, an implantation damage layer 302 (the portion marked with cross marks in FIG. 28) is formed on the side surface (the side surface on the right side in FIG. 28) and the bottom surface of the deep trench.

In step S104, the resist 301 is peeled, and a silicon oxide film (BSG) 303 containing boron (B) is deposited on the entire surface of the wafer, using the ALD. The BSG film 303 is formed on the front surface of the wafer where the deep trench is not formed, the side surface of the deep trench (the side surface including the implantation damage layer 302), and the bottom surface of the deep trench (the bottom surface including the implantation damage layer 302) by the processing in step S104. Since phosphorus (B) is used here, the BSG film 204 is formed as a P-type film.

In step S105 (FIG. 29), the thermal diffusion processing is executed. In step S105, the wafer is annealed, so that boron (B) is solid-phase diffused from the BSG film 303 to the Si substrate 70 in the region where the BSG film 303 and the Si substrate 70 are in contact with each other. At this time, boron (B) is also solid-phase diffused in the implantation damage layer 302.

As illustrated in step S105 in FIG. 28, P-type impurity regions 304 and 305 are formed. The P-type impurity region 305 is a region formed in the implantation damage layer 302. The P-type impurity region 304 is a region to serve as the P-type solid phase diffusion layer 83 having the predetermined thickness, and the P-type impurity region 305 is a region to serve as the P-type solid phase diffusion layer 83 thinner than the predetermined thickness.

In step S106, the BSG film 303 is removed. The removal of the BSG film 303 can be performed by, for example, wet etching using hydrofluoric acid. The implantation damage layer 302 is also etched when the BSG film 303 is removed. Therefore, the sidewall of the deep trench illustrated on the right side in FIG. 28, which is also the solid-phase diffused Si substrate 70, is also etched. That is, the P-type impurity region 305 is cut to be thin in thickness.

In this way, shades of the P-type solid phase diffusion layer 83 can be created.

In step S107, polysilicon is embedded as the filling material 86 in the trench, and unnecessary polysilicon deposited on the upper surface of the wafer is removed. Furthermore, the pixel transistors, wiring, and the like are also formed. Thereafter, the Si substrate 70 is thinned from the back side. This thinning is performed until the bottom of the deep trench is exposed.

In this manner, the pixel 50r in which the portion where the P-type solid phase diffusion layer 83 is formed to have the predetermined thickness and the portion where the P-type solid phase diffusion layer 83 is formed to be thinner than the predetermined thickness are mixed, as illustrated in FIGS. 26 and 27, is formed. The pixel 50r formed as described above can be configured such that the N-type solid phase diffusion layer 84 is not in contact with a back surface Si interface 75 of the Si substrate 70, weakening of pinning of electric charges can be prevented, and flowing of the electric charge into the PD 71 and deterioration of Dark characteristics can be prevented. Furthermore, the arrangement region for transistors can be made large, and the degree of freedom regarding arrangement of the transistors can be increased.

Seventeenth Embodiment

Another process of manufacturing the pixel 50r in the sixteenth embodiment described with reference to FIGS. 26 and 27 will be described.

Figure 30:
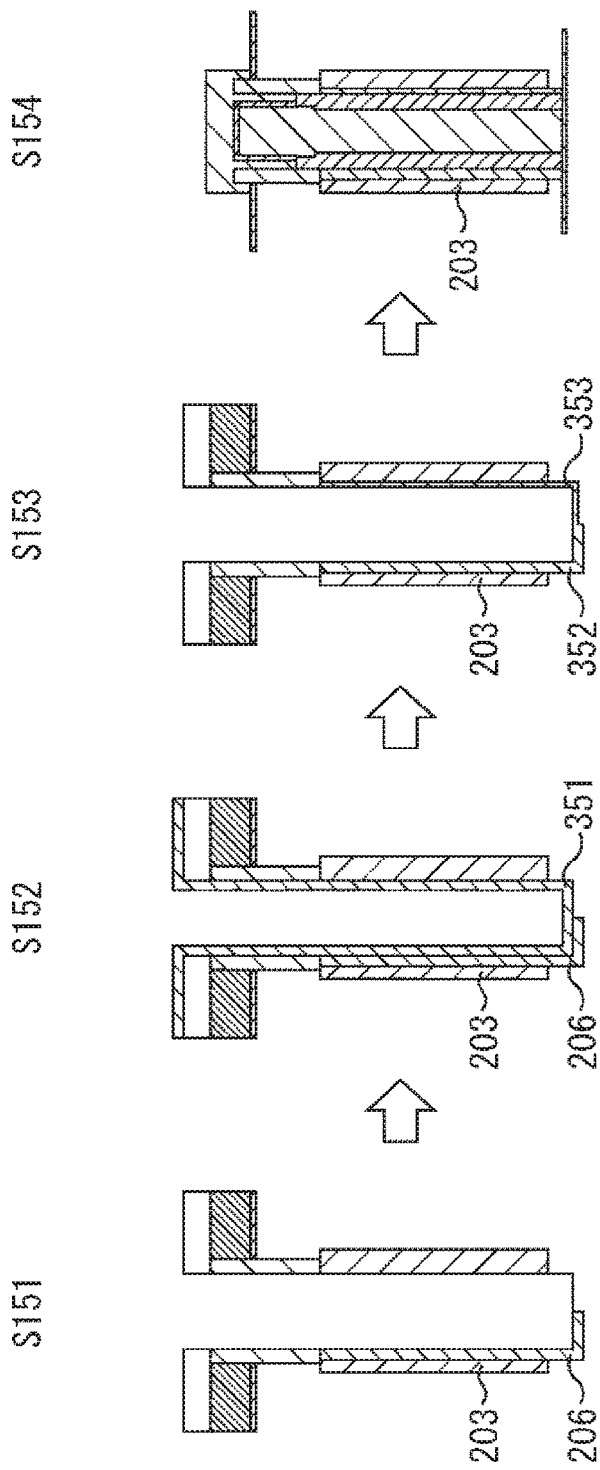
FIG. 30 is a view for describing manufacture of a pixel to which the present technology is applied.

In the case of manufacturing the pixel 50r in which the portion where the P-type solid phase diffusion layer 83 is formed to have the predetermined thickness and the portion where the P-type solid phase diffusion layer 83 is formed to be thinner than the predetermined thickness are mixed, the pixel 50r can be manufactured by the manufacturing process illustrated in FIG. 30.

Even in this case, the flow of forming the P-type solid phase diffusion layer 83 after forming the N-type solid phase diffusion layer 84 on the side surface of the DTI 82 is similar to the flow of manufacturing the pixel 50q in the fifteenth embodiment. Therefore, processing up to forming the N-type solid phase diffusion layer 84 has already been described when manufacturing the pixel 50q in the fifteenth embodiment and thus description thereof is omitted.

The N-type impurity region 203 to serve as the N-type solid phase diffusion layer 84 is formed on the side surface of the DTI 82 by execution of the processing in steps S51 to S56 illustrated in FIG. 24. Moreover, when steps S57 to S61 in FIG. 25 are executed, a P-type impurity region 206 is formed in the portion formed to have the predetermined thickness, of the P-type solid phase diffusion layer 83.

The same state as in step S61 in FIG. 25 is illustrated in step S151 (FIG. 30). In step S151, the P-type impurity region 206 is formed by execution of the thermal diffusion processing. The P-type impurity region 206 is a region to serve as the P-type solid phase diffusion layer 83 formed to have the predetermined thickness. In step S151, when the P-type impurity region 206 is formed, the BSG film 204 (not illustrated in FIG. 30) is removed.

In step S152, a silicon oxide film (BSG) 351 containing boron (B) is deposited on the entire surface of the wafer, using the ALD method. The BSG film 351 is formed on the front surface of the wafer where the deep trench is not formed, the side surface of the deep trench (the side surface of the P-type impurity region 206), and the bottom surface of the deep trench (the bottom surface of the P-type impurity region 206) by the processing in step S153.

In step S153, the thermal diffusion processing is executed. In step S153, the wafer is annealed, so that boron (B) is solid-phase diffused from the BSG film 351 to the Si substrate 70 in the region where the BSG film 351 and the Si substrate 70 are in contact with each other. At this time, the already formed P-type impurity region 206 is also solid-phase diffused. Therefore, the P-type impurity region 206 becomes thick (the concentration becomes high).

Thus, by performing the P-type solid phase diffusion twice, P-type impurity regions 352 and 353 are formed, as illustrated in step S153 in FIG. 30. The P-type impurity region 352 is a region where the P-type impurity region 206 has been formed in the first P-type impurity region formation processing. The P-type impurity region 352 is a region to serve as the P-type solid phase diffusion layer 83 having the predetermined thickness, and the P-type impurity region 353 is a region to serve as the P-type solid phase diffusion layer 83 thinner than the predetermined thickness.

In step S154, polysilicon is embedded as the filling material 86 in the trench, and unnecessary polysilicon deposited on the upper surface of the wafer is removed. Furthermore, the pixel transistors, wiring, and the like are also formed. Thereafter, the Si substrate 70 is thinned from the back side. This thinning is performed until the bottom of the deep trench is exposed.

In this manner, the pixel 50r in which the portion where the P-type solid phase diffusion layer 83 is formed to have the predetermined thickness and the portion where the P-type solid phase diffusion layer 83 is formed to be thinner than the predetermined thickness are mixed, as illustrated in FIGS. 26 and 27, is formed. The pixel 50r formed as described above can be configured such that the N-type solid phase diffusion layer 84 is not in contact with a back surface Si interface 75 of the Si substrate 70, weakening of pinning of electric charges can be prevented, and flowing of the electric charge into the PD 71 and deterioration of Dark characteristics can be prevented. Furthermore, the arrangement region for transistors can be made large, and the degree of freedom regarding arrangement of the transistors can be increased.

Eighteenth Embodiment

Figure 31:
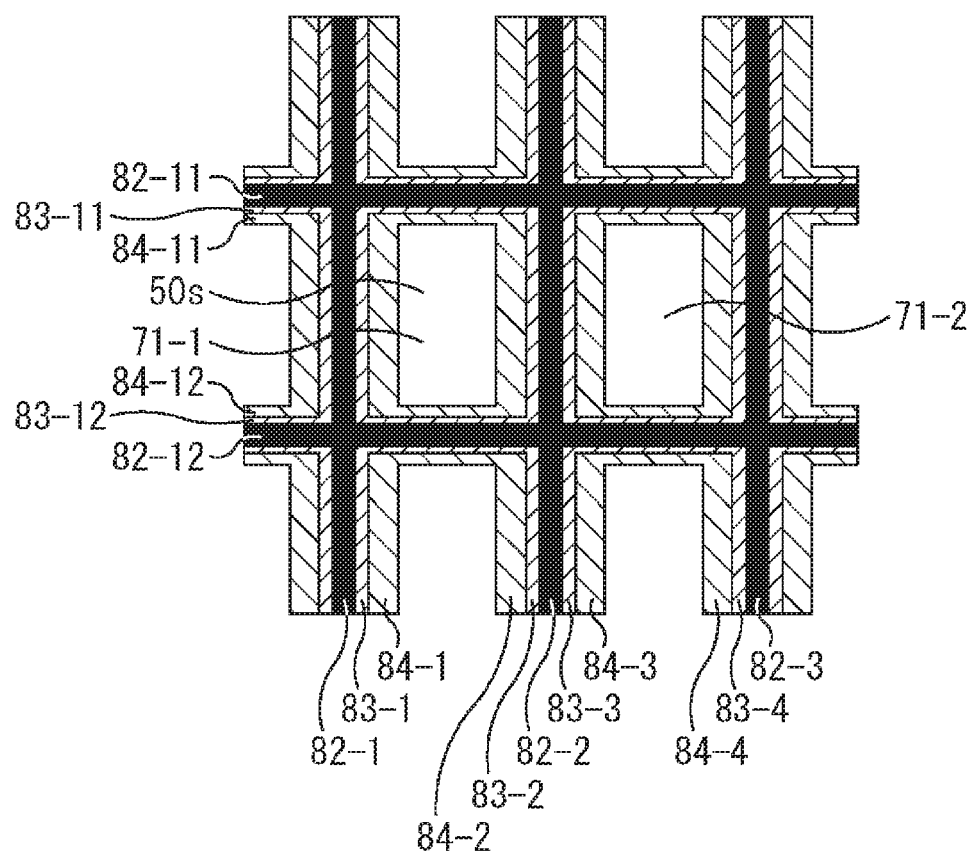
FIG. 31 is a plan view illustrating an eighteenth configuration example of a pixel to which the present technology is applied.

FIG. 31 is a plan view of a pixel 50s in an eighteenth embodiment to which the present technology is applied.

The pixel 50r described with reference to FIGS. 26 and 27 is an embodiment in which a part of the strong electric field region surrounding the PD 71 is thinly formed Specifically, in the embodiment, the P-type solid phase diffusion layer 83 is thinly formed, and the N-type solid phase diffusion layer 84 is not thinly formed.

The pixel 50s in the eighteenth embodiment is similar to the above-described pixel 50r in that a part of a strong electric field region surrounding a PD 71 is thinly formed, but is different in that both of a P-type solid phase diffusion layer 83 and an N-type solid phase diffusion layer 84 are thinly formed in the thinly formed portion.

The pixel 50s in the eighteenth embodiment has a configuration in which the strong electric field region surrounding the PD 71 is partially thinned. When focusing on a PD71-1 included in the pixel 50s by referring to the pixel 50s illustrated in FIG. 31, strong electric field regions are formed on four sides surrounding the PD71-1, but a P-type solid phase diffusion layer 83 formed on upper and lower two sides is formed to be thinner than the P-type solid phase diffusion layer 83 formed on right and left two sides, and an N-type solid phase diffusion layer 84 formed on upper and lower two sides is formed to be thinner than the N-type solid phase diffusion layer 84 formed on right and left two sides.

In this case, a P-type solid phase diffusion layer 83-1 and an N-type solid phase diffusion layer 84-1 are formed in a DTI 82-1 on the left side in FIG. 31 of the PD 71-1, and a P-type solid phase diffusion layer 83-2 and an N-type solid phase diffusion layer 84-2 are formed in a DTI 82-2 on the right side in FIG. 31 of the PD 71-1. Therefore, a strong electric field regions are respectively formed on the left side and the right side in FIG. 31 of the PD 71-1.

Furthermore, in a DTI 82-11 on the upper side in FIG. 31 of the PD71-1, a P-type solid phase diffusion layer 83-11 and an N-type solid phase diffusion layer 84-11 are formed but the P-type solid phase diffusion layer 83-11 and the N-type solid phase diffusion layer 84-11 are thinly formed. Furthermore, in a DTI 82-12 on the lower side in FIG. 31 of the PD71-1, a P-type solid phase diffusion layer 83-12 and an N-type solid phase diffusion layer 84-12 are formed but the P-type solid phase diffusion layer 83-12 and the N-type solid phase diffusion layer 84-12 are thinly formed.

The P-type solid phase diffusion layers 83-1 and 83-2 are formed to have substantially the same thickness, and the P-type solid phase diffusion layers 83-11 and 83-12 are formed to have substantially the same thickness, among the P-type solid phase diffusion layers 83-1, 83-2, 83-11, and 83-12 formed on four sides of the PD71-1. Furthermore, the P-type solid phase diffusion layers 83-11 and 83-12 are formed to be thinner than the P-type solid phase diffusion layers 83-1 and 83-2.

The N-type solid phase diffusion layers 84-1 and 84-2 are formed to have substantially the same thickness, and the N-type solid phase diffusion layers 84-11 and 84-12 are formed to have substantially the same thickness, among the N-type solid phase diffusion layers 84-1, 84-2, 84-11, and 84-12 formed on four sides of the PD71-1. Furthermore, the N-type solid phase diffusion layers 84-11 and 84-12 are formed to be thinner than the N-type solid phase diffusion layers 84-1 and 84-2.

By providing the side where the strong electric field region is thin in this way, (a part of) the pixel transistors can be arranged on the side, and the region where the pixel transistors are arranged is widened and the degree of freedom regarding arrangement of the pixel transistors can be increased.

FIG. 31 illustrates the case where the strong electric field region is thinly formed (the P-type solid phase diffusion layer 83 and the N-type solid phase diffusion layer 84 are thin) on two sides of the four sides of the pixel 50s when focusing on one pixel 50s. However, the present technology can be applied to a case where the strong electric field region is formed to be thin on one side or on three sides, for example.

For example, although not illustrated, in a case of two-pixel sharing in which vertically arranged pixels 50s share a predetermined transistor, as in the pixels 50p illustrated in FIG. 22, the strong electric field region thinner than the other sides may be formed on a side between the pixels that are the sharing pixels.

Figure 32:
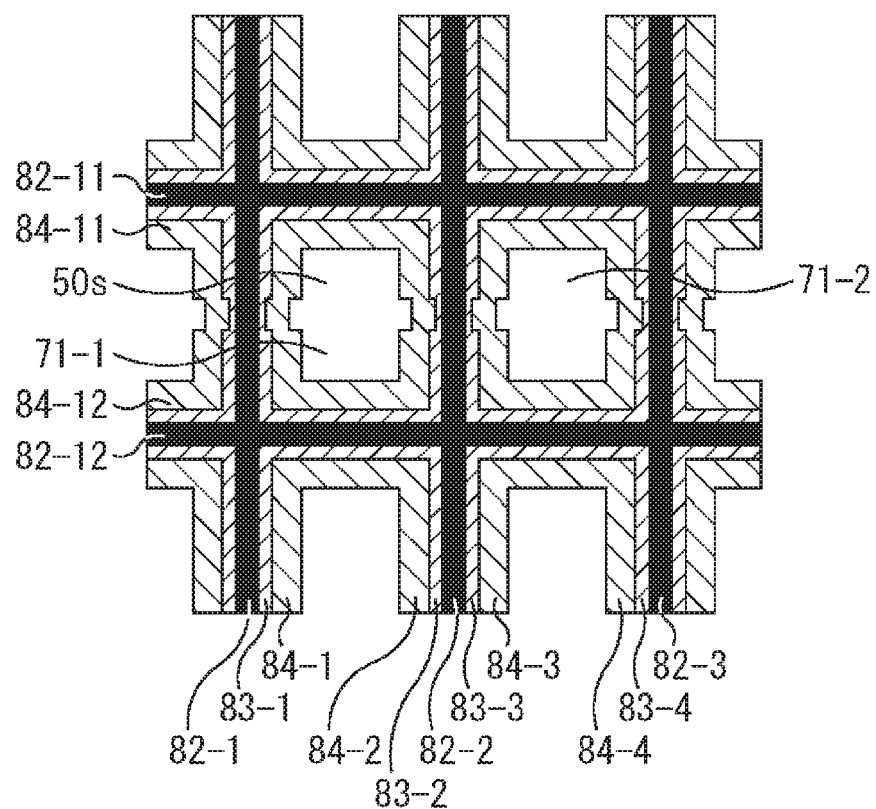
FIG. 32 is a plan view illustrating another eighteenth configuration example of a pixel to which the present technology is applied.

Furthermore, as illustrated in FIG. 32, a configuration in which the P-type solid phase diffusion layer 83 and the N-type solid phase diffusion layer 84 are thinly formed on a part of sides of one pixel 50s can be adopted. In the example illustrated in FIG. 32, a region where the P-type solid phase diffusion layer 83 and the N-type solid phase diffusion layer 84 are thinly formed is provided near centers of right side and left side of the pixel 50s. The region where the P-type solid phase diffusion layer 83 and the N-type solid phase diffusion layer 84 are thinly formed is described as depression.

For example, the P-type solid phase diffusion layer 83-1 and the N-type solid phase diffusion layer 84-1 on the left side of the PD 71-1 have a depression formed in a central portion. Furthermore, the P-type solid phase diffusion layer 83-2 and the N-type solid phase diffusion layer 84-2 on the right side of the PD 71-1 have a depression formed in a central portion. In this way, a portion where the P-type solid phase diffusion layer 83 and the N-type solid phase diffusion layer 84 are thinly formed (the depression of the P-type solid phase diffusion layer 83 and the N-type solid phase diffusion layer 84) may be provided on a predetermined side.

Furthermore, FIG. 32 illustrates the case where the portion where the P-type solid phase diffusion layer 83 and the N-type solid phase diffusion layer 84 are thinly formed (depression) is formed on two sides of four sides of the pixel 50s. However, the depression may be formed in one side, three sides, or four sides of the four sides.

The number of the depressions formed in one side may be one or plural. Furthermore, the size of one depression can be appropriately set according to the size of a transistor to be arranged, for example.

Figure 35:
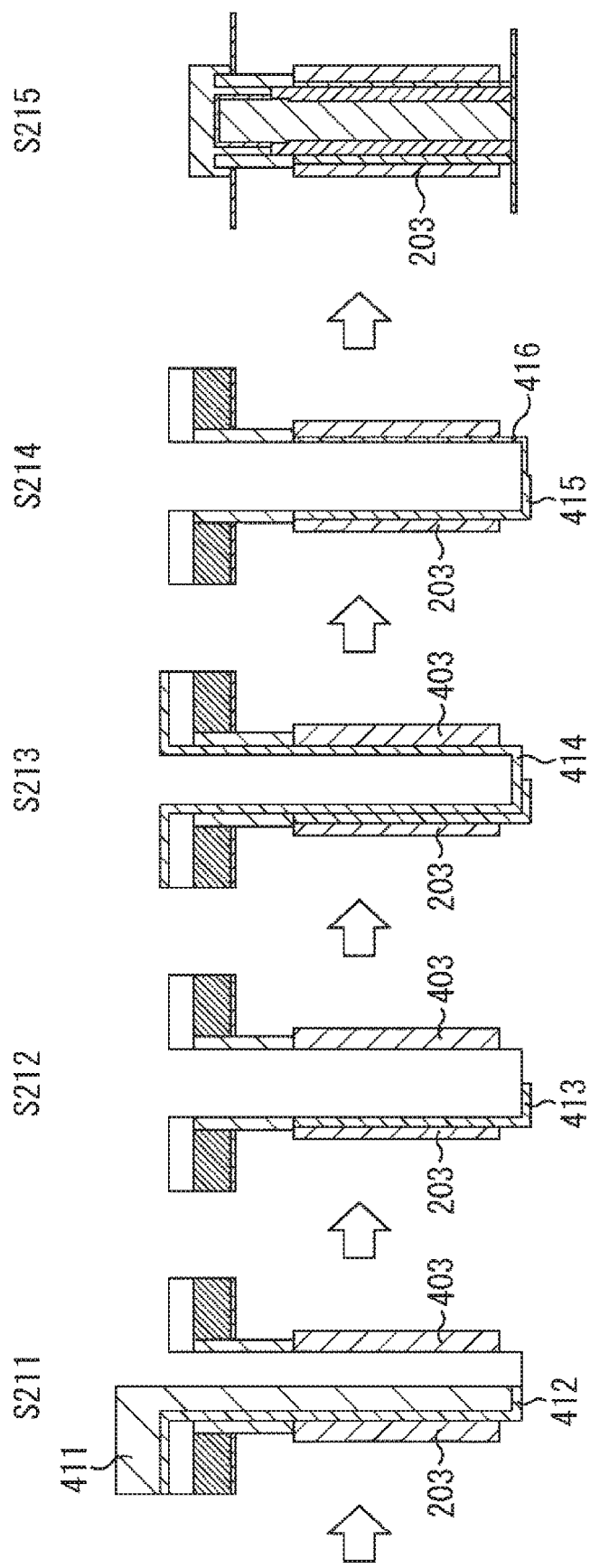
FIG. 35 is a view for describing manufacture of a pixel to which the present technology is applied.

A method of manufacturing the strong electric field region in the case of providing a region where the P-type solid phase diffusion layer 83 and the N-type solid phase diffusion layer 84 are formed to be thinner than a predetermined thickness and a region where the P-type solid phase diffusion layer 83 and the N-type solid phase diffusion layer 84 are formed to have the predetermined thickness in a sidewall of the DTI 82 will be described with reference to FIGS. 33 and 35.

Even in this case, the flow of forming the P-type solid phase diffusion layer 83 after forming the N-type solid phase diffusion layer 84 on the side surface of the DTI 82 is similar to the flow of manufacturing the pixel 50q of the fifteenth embodiment. When the N-type solid phase diffusion layer 84 is formed on the side surface of the DTI 82, N-type solid phase diffusion is performed twice. Thereafter, when the P-type solid phase diffusion layer 83 is formed, P-type solid phase diffusion is performed twice.

Steps S201 (FIG. 33) to S203 are steps including the same processing as steps S51 to S53 in FIG. 24. That is, in step S201, a substrate for forming DTI 82 is prepared. A silicon oxide film 200 is formed on the substrate, and an insulating film (insulating material) 201 is embedded in a formed groove. LP-TEOS is deposited as the silicon oxide film 200, for example.

In step S202, a part of the silicon oxide film 200, a part of an insulating film 201, a part of SiN, and a part of a Si substrate 70 are dug by dry etching. By step S102, a deep groove (deep trench) is formed.

In step S203, a silicon oxide film (PSG) 202 containing phosphorus (P) is deposited on the entire surface of the wafer, using the ALD method. Since phosphorus (P) is used here, the PSG film 202 is formed as an N-type film.

In step S204, processing of leaving a resist 401 applied to a portion corresponding to a portion where the N-type solid phase diffusion layer 84 is to be formed with the predetermined thickness is performed. In and after step S204, description will be continued on the assumption that the left side in FIG. 33 is a portion (side) where the P-type solid phase diffusion layer 83 and the N-type solid phase diffusion layer 84 are formed to have the predetermined thickness, and the right side in FIG. 33 is a portion (side) where the P-type solid phase diffusion layer 83 and the N-type solid phase diffusion layer 84 are formed to be thinner than the predetermined thickness.

Figure 33:
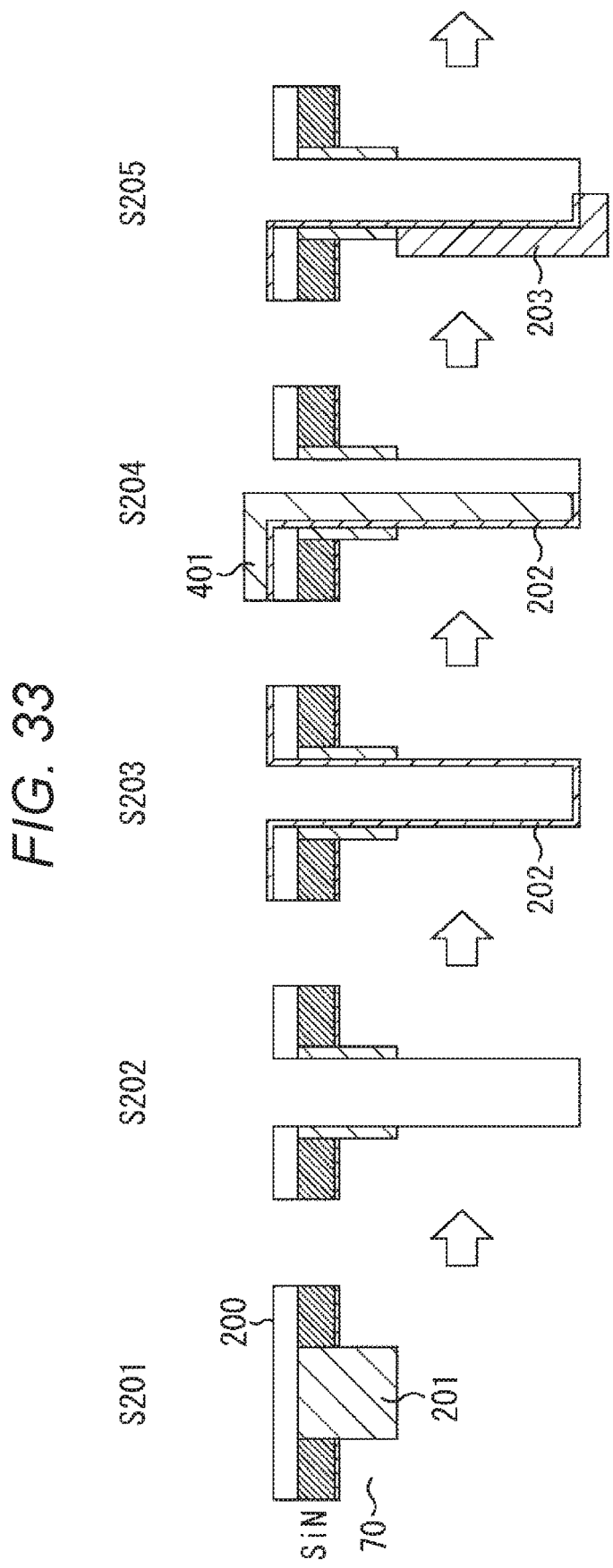
FIG. 33 is a view for describing manufacture of a pixel to which the present technology is applied.

Step S204 in FIG. 33 illustrates a state where the resist 401 is left. For example, steps similar to steps S101 and S102 in FIG. 28 are performed, so that the resist 401 in a portion corresponding to a portion where the N-type solid phase diffusion layer 84 is to be formed with the predetermined thickness is left.

The resist 401 is applied to the entire surface of the wafer, the resist 401 is masked and exposed to light and peeled, so that the resist 401 applied to the portion corresponding to the portion where the N-type solid phase diffusion layer 84 is thinly formed is removed, so that the resist 401 applied to the portion corresponding to the portion where the N-type solid phase diffusion layer 84 is to be formed with the predetermined thickness is left.

Furthermore, in step S204, the PSG film 202 other than the portion covered with the resist 401 is removed. The removal of the PSG film 202 can be performed by, for example, wet etching using hydrofluoric acid. By this processing, the PSG film 202 other than the PSG film 202 covered with the resist 401 is removed.

In step S205, the resist 401 is removed and thermal diffusion processing is performed, so that phosphorus (P) is solid-phase diffused from the PSG film 202 to the Si substrate 70 and an N-type impurity region 203 is formed in a region where the PSG film 202 and the Si substrate 70 are in contact. The N-type impurity region 203 is a region to serve as the N-type solid phase diffusion layer 84 having the predetermined thickness.

In step S206 (FIG. 34), the PSG film 202 remaining on the wafer is removed. The removal of the PSG film 202 can be performed by, for example, wet etching using hydrofluoric acid.

In step S207, a silicon oxide film (PSG) 402 containing phosphorus (P) is deposited on the entire surface of the wafer, using the ALD method.

In step S208, the thermal diffusion processing is executed, so that phosphorus (P) is solid-phase diffused from a PSG film 403 to the Si substrate 70 in the region where the PSG film 403 and the Si substrate 70 are in contact with each other. At this time, the already formed N-type impurity region 203 is also solid-phase diffused. Therefore, the N-type impurity region 203 becomes thick (the concentration becomes high).

Figure 34:
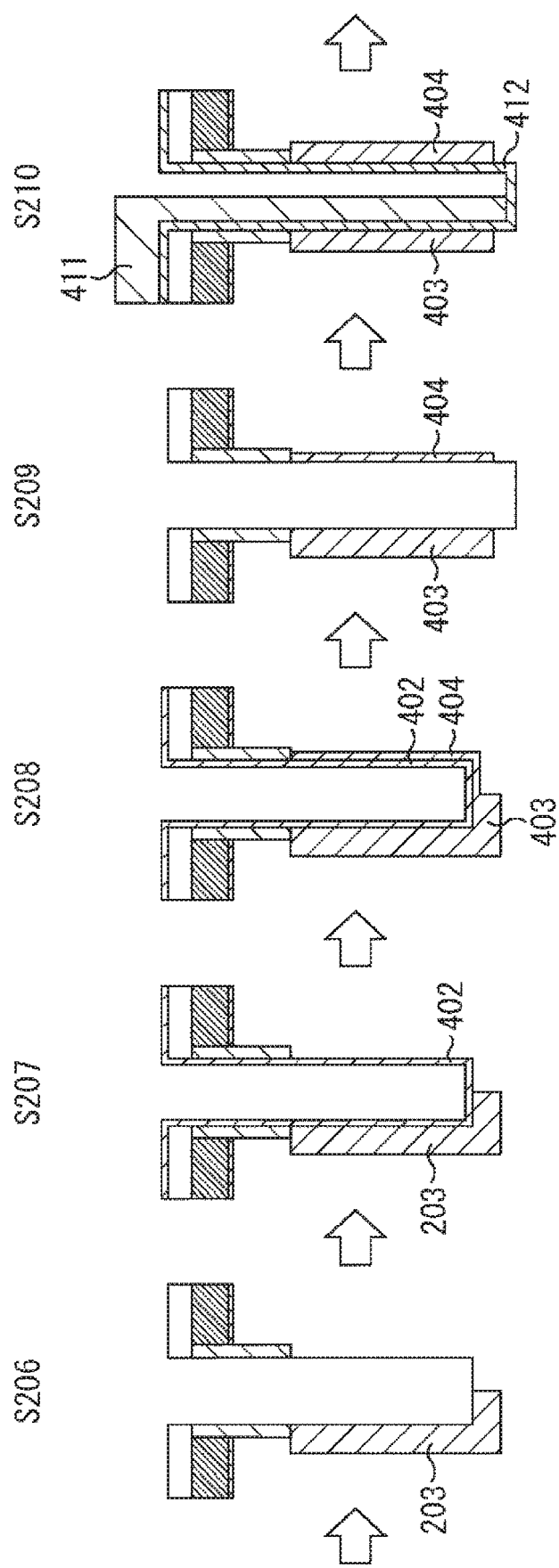
FIG. 34 is a view for describing manufacture of a pixel to which the present technology is applied.

Thus, by performing the N-type solid phase diffusion twice, N-type impurity regions 403 and 404 are formed, as illustrated in step S208 in FIG. 34. The N-type impurity region 403 is a region where the N-type impurity region 203 has been formed in the first N-type impurity region formation processing. The N-type impurity region 403 is a region to serve as the N-type solid phase diffusion layer 84 having the predetermined thickness, and the N-type impurity region 404 is a region to serve as the N-type solid phase diffusion layer 84 thinner than the predetermined thickness.

Next, a portion to serve as the P-type solid phase diffusion layer 83 is formed. The P-type solid phase diffusion layer 83 is also formed by executing P-type solid phase diffusion twice. By performing the solid phase diffusion twice, the processing of forming the P-type solid phase diffusion layer 83 can be similarly performed to the case described with reference to FIG. 30.

In step S210, a silicon oxide film (BSG) 412 containing boron (B) is deposited on the entire surface of the wafer, using the ALD method. Furthermore, in step S210, processing of leaving a resist 411 applied to a portion corresponding to a portion where the P-type solid phase diffusion layer 83 is to be formed with the predetermined thickness is performed.

Step S210 in FIG. 33 illustrates a state where the resist 411 is left. For example, the resist 411 is applied to the entire surface of the wafer, the resist 411 is masked and exposed to light and peeled, so that the resist 411 applied to the portion corresponding to the portion where the P-type solid phase diffusion layer 83 is to be thinly formed is removed, so that the resist 411 applied to the portion corresponding to the portion where the P-type solid phase diffusion layer 83 is to be formed with the predetermined thickness is left, as in step S204.

In step S211 (FIG. 35), the BSG film 412 that is not covered with the resist 411 is removed. The removal of the BSG film 412 can be performed by, for example, wet etching using hydrofluoric acid. By the processing, the BSG film 412 other than the BSG film 412 covered with the resist 411 is removed.

In step S212, a P-type impurity region 413 is formed by execution of the thermal diffusion processing. The P-type impurity region 413 is a region to serve as the P-type solid phase diffusion layer 83 formed to have the predetermined thickness. In step S212, when the p-type impurity region 413 is formed, the BSG film 412 is removed.

In step S213, a second P-type impurity region is formed. A silicon oxide film (BSG) 414 containing boron (B) is deposited on the entire surface of the wafer, using the ALD method. Then, in step S214, the thermal diffusion processing is executed. At this time, the already formed P-type impurity region 413 is also solid-phase diffused. Therefore, the P-type impurity region 413 becomes thick (the concentration becomes high).

Thus, P-type impurity regions 415 and 416 are formed by performing the P-type solid phase diffusion twice. The P-type impurity region 415 is a region where the P-type impurity region 413 has been formed in the first P-type impurity region formation processing. The P-type impurity region 415 is a region to serve as the P-type solid phase diffusion layer 83 having the predetermined thickness, and the P-type impurity region 416 is a region to serve as the P-type solid phase diffusion layer 83 thinner than the predetermined thickness.

In step S215, polysilicon is embedded as the filling material 86 in the trench, and unnecessary polysilicon deposited on the upper surface of the wafer is removed. Furthermore, the pixel transistors, wiring, and the like are also formed. Thereafter, the Si substrate 70 is thinned from the back side. This thinning is performed until the bottom of the deep trench is exposed.

In this manner, the pixel 50s having the depression formed in the P-type solid phase diffusion layer 83 and the N-type solid phase diffusion layer 84, as illustrated in FIGS. 31 and 32, is formed. The pixel 50s formed as described above can be configured such that the N-type solid phase diffusion layer 84 is not in contact with the back surface Si interface 75 of the Si substrate 70, weakening of pinning of electric charges can be prevented, and flowing of the electric charge into the PD 71 and deterioration of Dark characteristics can be prevented. Furthermore, the arrangement region for transistors can be made large, and the degree of freedom regarding arrangement of the transistors can be increased.

Application Example to Endoscopic Surgical System

Furthermore, for example, the technology (present technology) according to the present disclosure may be applied to an endoscopic surgical system.

Figure 36:
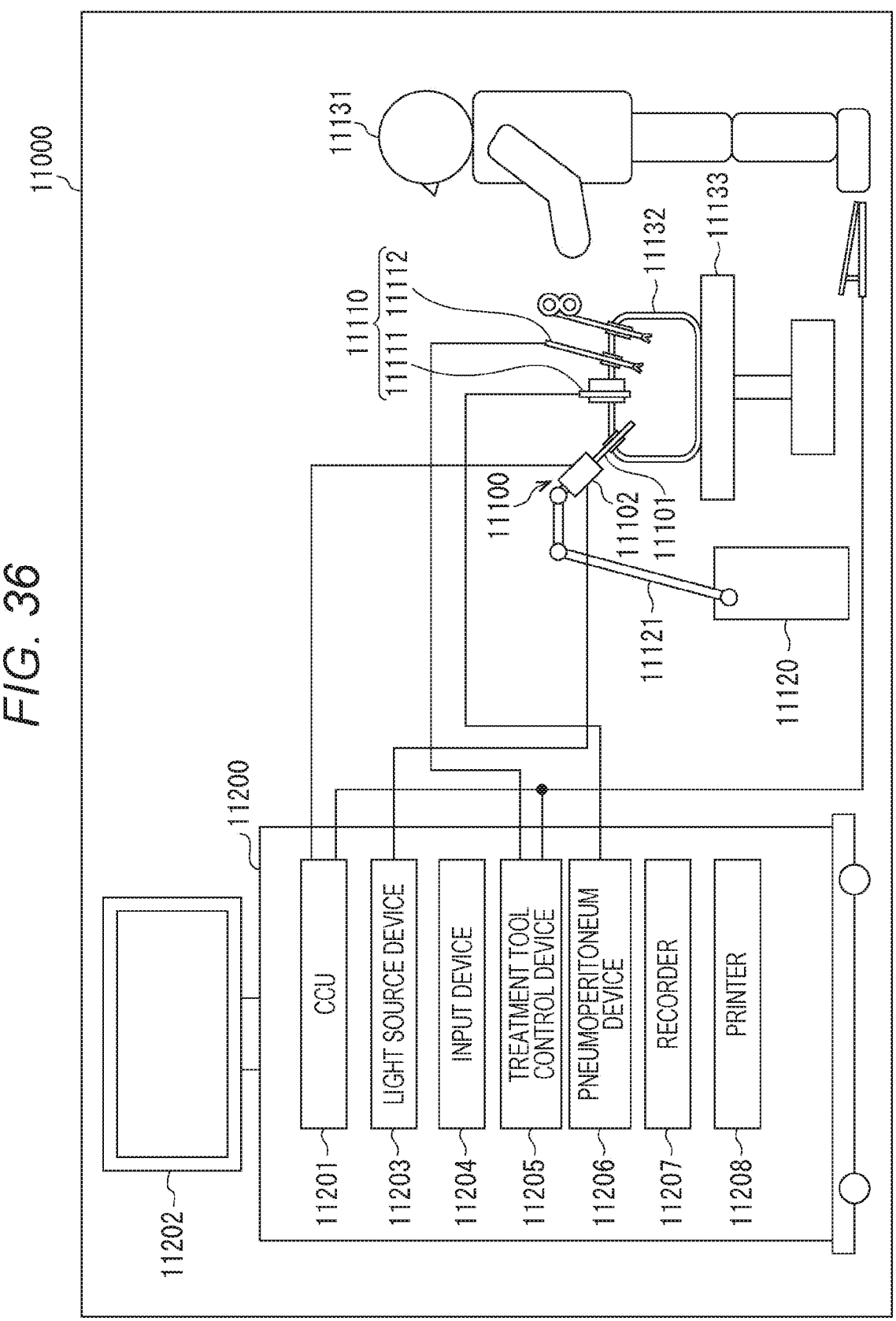
FIG. 36 is a diagram illustrating an example of a schematic configuration of an endoscopic surgical system.

FIG. 36 is a diagram illustrating an example of a schematic configuration of an endoscopic surgical system to which the technology according to the present disclosure (present technology) is applicable.

FIG. 36 illustrates a state in which an operator (surgeon) 11131 is performing surgery for a patient 11132 on a patient bed 11133, using the endoscopic surgical system 11000. As illustrated in FIG. 53, the endoscopic surgical system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

Figure 37:
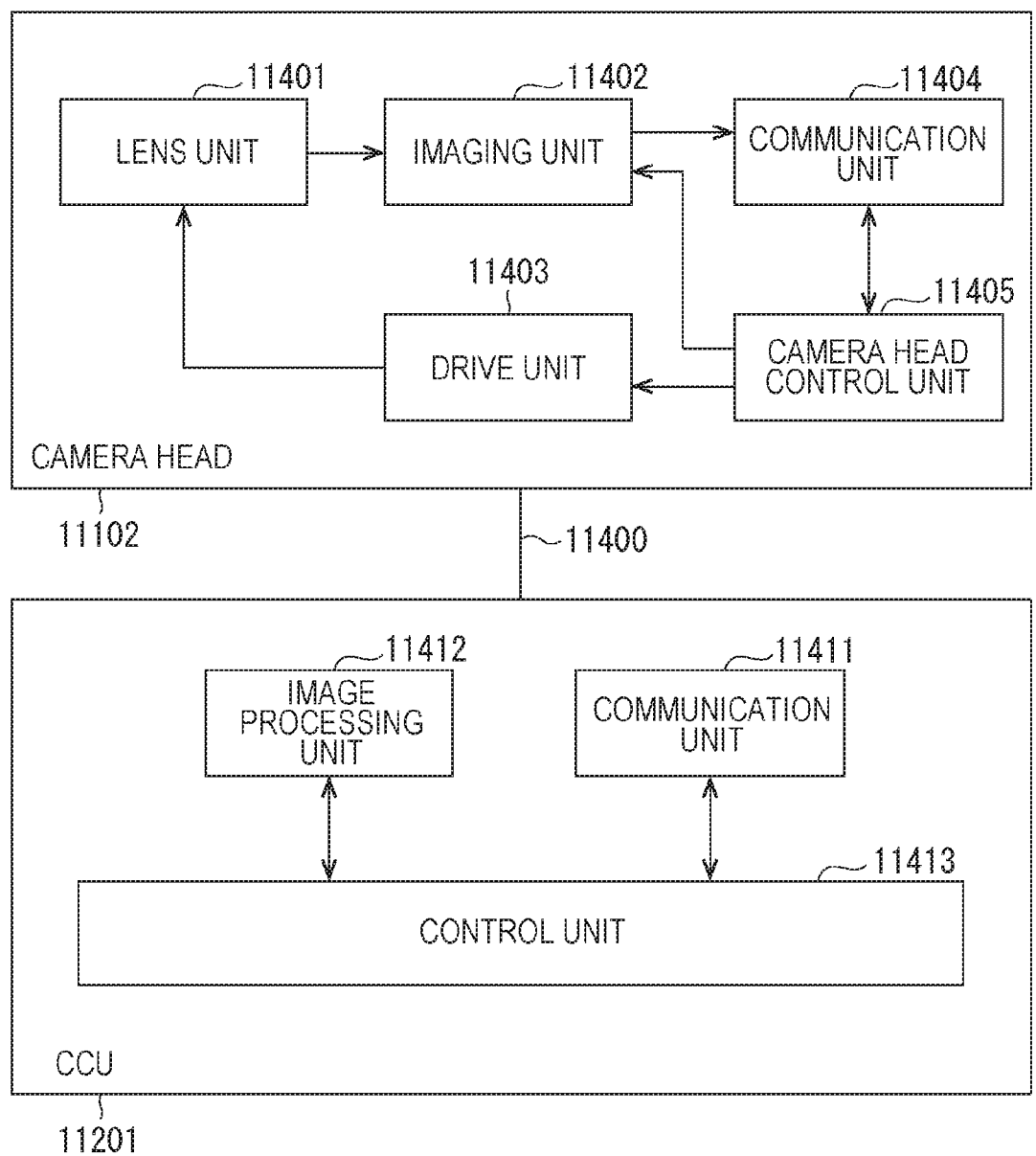
FIG. 37 is a block diagram illustrating an example of functional configurations of a camera head and a CCU.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 37 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a forward-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, in other words, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Moreover, the CCU 11201 receives the image signal from the camera head 11102, and applies various types of image processing for displaying an image based on the image signal, such as developing processing (demosaicing processing) or the like, to the image signal.

The display device 11202 displays the image based on the image signal to which the image processing has been applied by the CCU 11201, by control of the CCU 11201.

The light source device 11203 includes a light source such as a light emitting diode (LED) for example, and supplies irradiation light to the endoscope 11100 in capturing an operation portion or the like.

An input device 11204 is an input interface for the endoscopic surgical system 11000. A user can input various types of information and instructions to the endoscopic surgical system 11000 through the input device 11204. For example, the user inputs an instruction to change imaging conditions (a type of irradiation light, a magnification, a focal length, and the like) by the endoscope 11100, and the like.

A treatment tool control device 11205 controls drive of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a text, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the drive of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, drive of the light source device 11203 may be controlled to change intensity of light to be output every predetermined time. The drive of the imaging element of the camera head 11102 is controlled in synchronization with change timing of the intensity of light and images are acquired in a time division manner, and the images are synthesized, so that a high-dynamic range image without so-called clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to observe fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image, for example, can be performed. The light source device 11203 can be configured to be able to supply narrow band light and/or exciting light corresponding to such special light observation.

FIG. 37 is a block diagram illustrating an example of functional configurations of the camera head 11102 and the CCU 11201 illustrated in FIG. 36.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured by a combination of a plurality of lenses including a zoom lens and a focus lens.

The imaging element that configures the imaging unit 11402 may be one imaging element (so-called single imaging element) or may be a plurality of imaging elements (so-called multiple imaging elements). In a case where the imaging unit 11402 is configured by multiple imaging elements, for example, a color image may be obtained by generating image signals respectively corresponding to RGB by the imaging elements and synthesizing the image signals. Alternatively, the imaging unit 11402 may be configured by a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured by the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured by an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured by a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling drive of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls drive of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling drive of the camera head 11102 to the camera head 11102. The image signal and the control signal can be transmitted through telecommunication, optical communication, or the like.

The image processing unit 11412 applies various types of image processing to the image signal as a raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling drive of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion using a result of the recognition, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

Note that, here, the endoscopic surgical system has been described as an example. However, the technology according to the present disclosure may be applied to microsurgery or the like, for example.

Application Example to Moving Bodies

Furthermore, for example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 38:
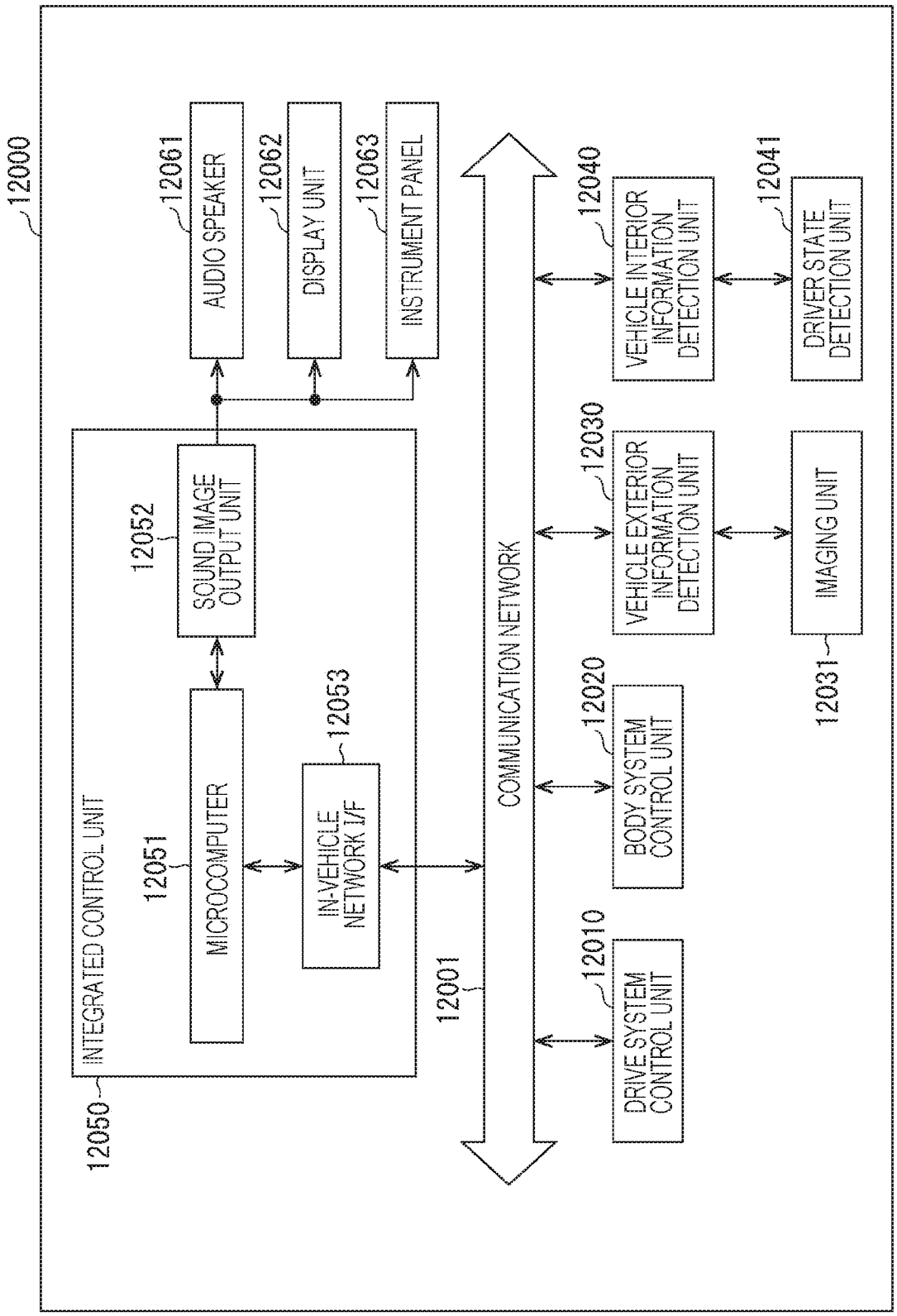
FIG. 38 is a block diagram illustrating an example of a schematic configuration of a vehicle control system.

FIG. 38 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 38, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a light reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 38, as the output device, an audio speaker 12061, a display unit 12062, and an instrument panel 12063 are exemplarily illustrated. The display unit 12062 may include, for example, at least one of an on-board display or a head-up display.

Figure 39:
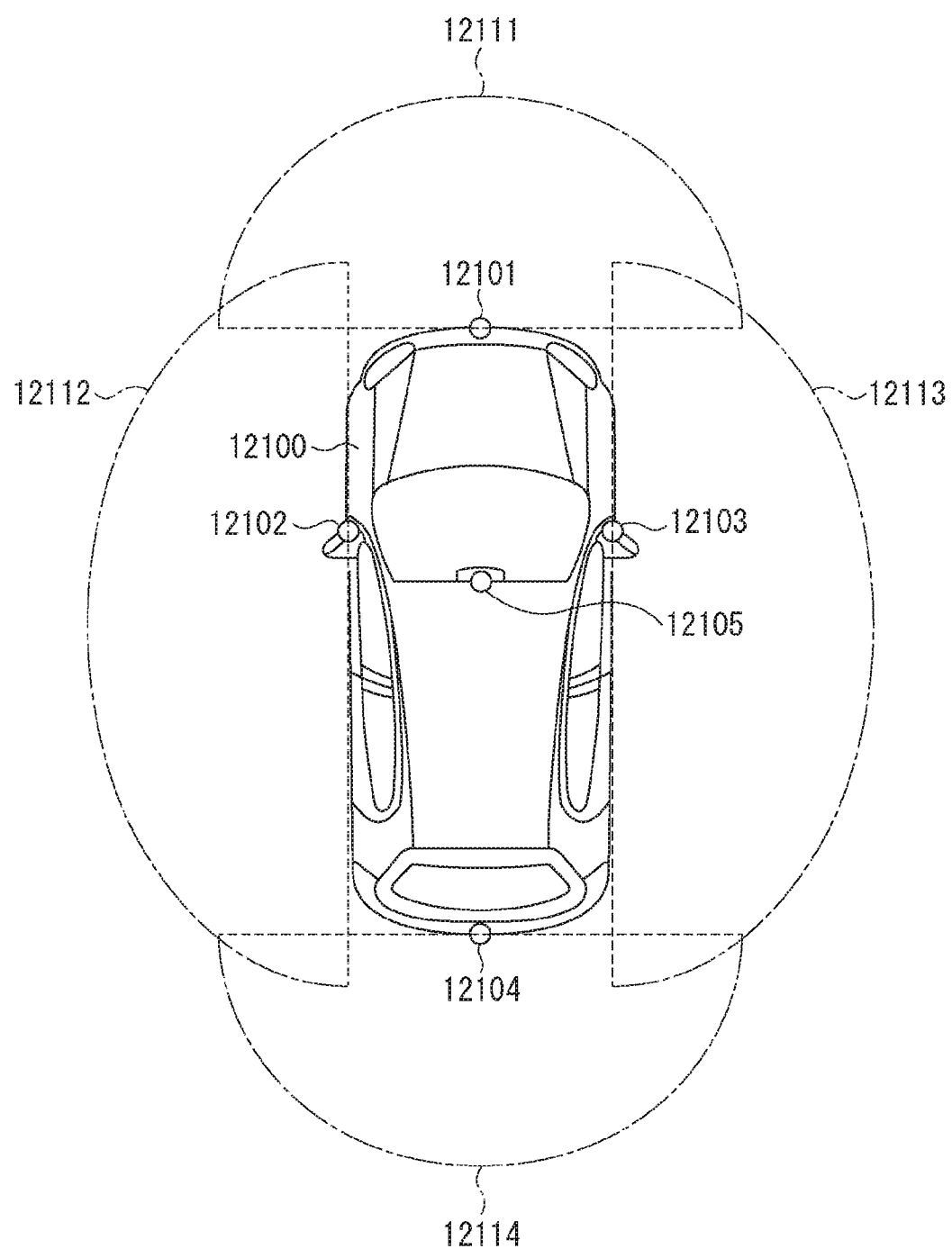
FIG. 39 is an explanatory diagram illustrating an example of installation positions of a vehicle exterior information detection unit and an imaging unit.

FIG. 39 is a diagram illustrating an example of an installation position of the imaging unit 12031.

In FIG. 39, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 39 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of image sensors or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

Note that embodiments of the present technology are not limited to the above-described embodiments, and various modifications can be made without departing from the gist of the present technology.

The present technology can also have the following configurations.

(1)

A solid-state imaging device including:

a photoelectric conversion unit configured to perform photoelectric conversion;

a trench penetrating a semiconductor substrate in a depth direction and formed between the photoelectric conversion units respectively formed in adjacent pixels; and a PN junction region configured by a P-type region and an N-type region on a sidewall of the trench, in which a part of sides surrounding the photoelectric conversion unit includes a region where the P-type region is not formed or a region where the P-type region is thinly formed.

(2)

The solid-state imaging device according to (1), in which the PN junction region is formed on at least one side of four sides surrounding the photoelectric conversion unit, and the P-type region is not formed on the remaining sides.

(3)

The solid-state imaging device according to (1), in which the P-type region forming the PN junction region is formed to be thinner in thickness on at least one side of four sides surrounding the photoelectric conversion unit than the other P-type region.

(4)

The solid-state imaging device according to (1), in which the P-type region forming the PN junction region is formed to be thinner in thickness in a part of the sides surrounding the photoelectric conversion unit than the other P-type region.

(5)

The solid-state imaging device according to (1), in which the PN junction region is formed to be thinner in thickness in a part of the sides surrounding the photoelectric conversion unit than the other PN junction region.

(6)

The solid-state imaging device according to any one of (1) to (5), in which the P-type region and the N-type region are solid phase diffusion layers.

(7)

An electronic device in which a solid-state imaging device is mounted, the solid-state imaging device including:

a photoelectric conversion unit configured to perform photoelectric conversion;

a trench penetrating a semiconductor substrate in a depth direction and formed between the photoelectric conversion units respectively formed in adjacent pixels; and a PN junction region configured by a P-type region and an N-type region on a sidewall of the trench, in which a part of sides surrounding the photoelectric conversion unit includes a region where the P-type region is not formed or a region where the P-type region is thinly formed.

REFERENCE SIGNS LIST

10 Imaging device
11 Lens group
12 Imaging element
13 DSP circuit
14 Frame memory
15 Display unit
16 Recording unit
17 Operation system
18 Power supply system
19 Bus line
20 CPU
31 Pixel
33 Vertical signal line
41 Pixel array unit
42 Vertical drive unit
43 Column processing unit
44 Horizontal drive unit
45 System control unit
46 Pixel drive line
47 Vertical signal line
48 Signal processing unit
49 Data storage unit
50 Pixel
70 Si substrate
72 P-type region
73 Flattening film
74 Light-shielding film
75 Back surface Si interface
77 Active region
79 Wiring layer
80 Transfer transistor
81 Vertical transistor trench
83 P-type solid phase diffusion layer
84 N-type solid phase diffusion layer
85 Sidewall film
86 Filling material
92 Reset transistor
93 Amplification transistor
94 Selection transistor
101 film
121 P-type region
122 N-type region
131 MOS capacitor
151 Well contact portion
152 Contact
153 Cu wiring
200 Silicon oxide film
201 Insulating film
202 PSG film
203 Impurity region
204 BSG film
205 Resist
206 Impurity region
301 Resist
302 Implantation damage layer
303 BSG film

What is claimed is:

1. A solid-state imaging device, comprising:
a photoelectric conversion unit configured to perform photoelectric conversion;
a trench penetrating a semiconductor substrate in a depth direction and surrounding the photoelectric conversion unit in a plan view; and
a PN junction region configured by a P-type region and an N-type region provided on a sidewall of the trench,
wherein the photoelectric conversion unit is surrounded by the PN junction region in the plan view, and
wherein an entire thickness of a horizontal sidewall of the P-type region is thinner than an entire thickness of a vertical sidewalls of the photoelectric conversion unit of the P-type region in the plan view.

2. The solid-state imaging device according to claim 1, wherein the P-type region includes first to fourth parts in the plan view, wherein the first to fourth parts of the P-type region are disposed along first to fourth sides of the PN junction region, respectively.

3. The solid-state imaging device according to claim 2, wherein a thickness of the first part of the P-type region is thinner than a thickness of the second part of the P-type region and thinner than a thickness of the third part of the P-type region in the plan view, and wherein the first part of the P-type region faces the fourth part of the P-type region in the plan view.

4. The solid-state imaging device according to claim 2, wherein the N-type region includes first to fourth parts in the plan view, and wherein the first to fourth parts of the N-type region are disposed along the first to fourth sides of the PN junction region respectively.

5. The solid-state imaging device according to claim 1, wherein
the P-type region and the N-type region are solid phase diffusion layers.

6. An electronic device in which a solid-state imaging device is mounted, the solid-state imaging device comprising:
a photoelectric conversion unit configured to perform photoelectric conversion;
a trench penetrating a semiconductor substrate in a depth direction and surrounding the photoelectric conversion unit in a plan view; and
a PN junction region configured by a P-type region and an N-type region provided on a sidewall of the trench,
wherein the photoelectric conversion unit is surrounded by the PN junction region in the plan view, and
wherein an entire thickness of a horizontal sidewall of the photoelectric conversion unit of the P-type region is thinner than an entire thickness of a vertical sidewall of the photoelectric conversion unit of the P-type region in the plan view.

7. The electronic device according to claim 6, wherein the P-type region includes first to fourth parts in the plan view, wherein the first to fourth parts of the P-type region are disposed along first to fourth sides of the PN junction region, respectively.

8. The electronic device according to claim 7, wherein a thickness of the first part of the P-type region is thinner than a thickness of the second part of the P-type region and thinner than a thickness of the third part of the P-type region in the plan view, and wherein the first part of the P-type region faces the fourth part of the P-type region in the plan view.

9. The electronic device according to claim 7, wherein the N-type region includes first to fourth parts in the plan view, and wherein the first to fourth parts of the N-type region are disposed along the first to fourth sides of the PN junction region respectively.

10. The electronic device according to claim 6, wherein the P-type region and the N-type region are solid phase diffusion layers.

11. The electronic device according to claim 7, wherein the first part of the P-type region and the fourth part of the P-type region have substantially a same thickness in the plan view.

12. The electronic device according to claim 7, wherein the second part of the P-type region and the third part of the P-type region have substantially a same thickness in the plan view.

13. The electronic device according to claim 7, wherein the first part of the P-type region and the fourth part of the P-type region are provided at either an upper portion or a lower portion of the photoelectric conversion unit.

14. The electronic device according to claim 7, wherein the second part of the P-type region and the third part of the P-type region are provided at either a left portion or a right portion of the photoelectric conversion unit.

15. The electronic device according to claim 9, wherein the first to fourth parts of the N-type regions have substantially a same thickness in the plan view.

16. The solid-state imaging device according to claim 2, wherein the first part of the P-type region and the fourth part of the P-type region have substantially a same thickness in the plan view.

17. The solid-state imaging device according to claim 2, wherein the second part of the P-type region and the third part of the P-type region have substantially a same thickness in the plan view.

18. The solid-state imaging device according to claim 2, wherein the first part of the P-type region and the fourth part of the P-type region are provided at either an upper portion or a lower portion of the photoelectric conversion unit.

19. The solid-state imaging device according to claim 2, wherein the second part of the P-type region and the third part of the P-type region are provided at either a left portion or a right portion of the photoelectric conversion unit.

20. The solid-state imaging device according to claim 4, wherein the first to fourth parts of the N-type regions have substantially a same thickness in the plan view.

* * * * *